US010483871B2

(12) United States Patent
Kikuchi et al.

(10) Patent No.: US 10,483,871 B2
(45) Date of Patent: Nov. 19, 2019

(54) POWER CONVERSION APPARATUS AND POWER SYSTEM

(71) Applicant: Mitsubishi Electric Corporation, Chiyoda-ku (JP)

(72) Inventors: Takeshi Kikuchi, Chiyoda-ku (JP); Toshiyuki Fujii, Chiyoda-ku (JP); Ryosuke Uda, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/311,872

(22) PCT Filed: Jun. 7, 2017

(86) PCT No.: PCT/JP2017/021147
§ 371 (c)(1),
(2) Date: Dec. 20, 2018

(87) PCT Pub. No.: WO2018/051587
PCT Pub. Date: Mar. 22, 2018

(65) Prior Publication Data
US 2019/0207533 A1    Jul. 4, 2019

(30) Foreign Application Priority Data

Sep. 13, 2016  (JP) ................. 2016-178473

(51) Int. Cl.
*H02M 1/32*     (2007.01)
*H02M 7/49*     (2007.01)
(Continued)

(52) U.S. Cl.
CPC ............. *H02M 7/49* (2013.01); *G01R 19/165* (2013.01); *H02M 1/32* (2013.01); *H02M 7/48* (2013.01);
(Continued)

(58) Field of Classification Search
CPC ......... H02M 7/483; H02M 2007/4835; H02M 1/32; H02M 2001/322; H02M 2001/325;
(Continued)

(56) References Cited

U.S. PATENT DOCUMENTS

2010/0066174 A1*  3/2010  Dommaschk ........... H02M 1/32
                                                         307/75
2013/0148392 A1    6/2013  Inoue et al.
(Continued)

FOREIGN PATENT DOCUMENTS

JP    2013-121223 A    6/2013
WO    2015/098146 A1   7/2015

OTHER PUBLICATIONS

InternationalSearch Report dated Aug. 8, 2017 in PCT/JP2017/021147 filed Jun. 7, 2017.
(Continued)

*Primary Examiner* — Alex Torres-Rivera
(74) *Attorney, Agent, or Firm* — Oblon, McClelland, Maier & Neustadt, L.L.P.

(57) ABSTRACT

When short-circuit between DC lines is detected, a control device of a power conversion device performs protection control to turn off semiconductor switching elements in a power converter, and when elimination of the short-circuit between the DC lines is detected, the control device performs restart control of the power converter by giving a voltage command value for causing negative-polarity current in flowing through a diode in an upper arm of a second series body of a second converter cell to flow to a phase arm 4, to each converter cell in first and second arms.

20 Claims, 16 Drawing Sheets

(51) Int. Cl.
*H02M 7/48* (2007.01)
*H02M 7/797* (2006.01)
*G01R 19/165* (2006.01)
*H02M 1/00* (2006.01)
*H02M 7/483* (2007.01)

(52) U.S. Cl.
CPC .... *H02M 7/797* (2013.01); *H02M 2001/0006* (2013.01); *H02M 2007/4835* (2013.01)

(58) Field of Classification Search
CPC .......... H02M 7/49; H02M 7/48; H02M 7/797; H02M 2001/0006; H02M 7/7575; G01R 19/165
USPC ............ 363/50, 51, 55, 56.01, 56.02, 56.03, 363/56.04
See application file for complete search history.

(56) References Cited

U.S. PATENT DOCUMENTS

2016/0094117 A1* 3/2016 Hu ......................... H02M 1/32
363/51
2016/0365787 A1* 12/2016 Geske ...................... H01T 1/14

OTHER PUBLICATIONS

Extended European Search Report issued in corresponding application 17850494.0, dated Sep. 4, 2019 (9 pages).

* cited by examiner

POWER CONVERSION APPARATUS AND POWER SYSTEM

TECHNICAL FIELD

The present invention relates to a large-capacity power conversion device in which an arm is formed by converter cells each including a plurality of semiconductor switching elements and a DC capacitor and which performs power conversion between an AC circuit and a DC circuit, and a power system including the power conversion device, and in particular, relates to restart control after short-circuit current of high-voltage DC lines is suppressed and the short-circuit is eliminated.

BACKGROUND ART

In large-capacity power conversion devices, output of a power converter is high voltage and large current, and therefore many of the large-capacity power conversion devices are configured such that a plurality of converters are multiplexed in series or in parallel. The multiplexing of the converters is not only for the purpose of increasing the capacity of the power converter. By combining outputs of the converters, harmonics contained in the output voltage waveform of the power converter are reduced, and as a result, harmonic current flowing out to a grid can be reduced.

There are various methods for multiplexing the converters, such as reactor multiplexing, transformer multiplexing, and direct multiplexing. The transformer multiplexing has an advantage that DC currents of the converters can be made to be the same current because the AC side is insulated by the transformer. However, there is a disadvantage that, if the output voltage is high voltage, the configuration of the multiplexed transformer is complicated, and the cost of the transformer increases.

Accordingly, as a power conversion device that is suited for high-voltage usage and that does not need a multiplexed transformer, a multilevel converter is proposed in which outputs of a plurality of converters are connected in cascade, and one of such multilevel converters is a modular multilevel converter (hereinafter, referred to as MMC).

The MMC is formed by an arm in which a plurality of unit converters (hereinafter, referred to as converter cells) which are called cells are connected in cascade. Each converter cell includes a plurality of semiconductor switching elements and a DC capacitor. Then, through ON/OFF switching of the semiconductor switching elements, both-end voltage of the DC capacitor and zero voltage are outputted.

In the case of three-phase MMC, the aforementioned arm is formed individually for each phase. These phase arms are connected in parallel to each other, and connection terminals at both ends connected in parallel are used as DC terminals. Each phase arm is composed of a positive arm and a negative arm each having a half of the total converter cells connected in cascade. The connection point between the positive arm and the negative arm serves as an AC-side input/output terminal.

Since outputs of each converter cell in the MMC are connected to both of the AC end and the DC end of the MMC, each converter cell has a characteristic of outputting both of DC current and AC current. That is, current flowing through each arm contains an AC component and a DC component. Therefore, in the MMC, the plurality of current components are controlled.

In addition, since the MMC is connected to both of the AC end and the DC end, it is necessary to cope with short-circuit, grid disturbance, and the like that can occur at each terminal. In particular, in the case where short-circuit or the like occurs at the DC end, power transmission is stopped until the short-circuit is eliminated. Therefore, it is necessary to swiftly eliminate the short-circuit and restart rated power transmission. If short-circuit occurs, the voltage of the DC end becomes zero, and therefore it is necessary to raise the DC output voltage of the power conversion device to the rated value in order to start power transmission after the short-circuit is eliminated. As a method for restarting the power conversion device without influencing the grid, a power conversion device restart method is disclosed in which DC voltage is gradually raised in a state of being interconnected with the AC grid, whereby overvoltage of DC lines is suppressed and the DC voltage is stably restored as follows.

Each arm of a power converter is formed by two types of unit converters, i.e., full-bridge-type unit converter and bidirectional-chopper-type unit converter. A command value distributing unit distributes an AC voltage command value and a DC voltage command value to an output voltage command value for a bidirectional chopper group and an output voltage command value for a full-bridge group. A gate pulse generation unit generates gate signals to be given to the respective full-bridge-type unit converters and gate signals to be given to the respective bidirectional-chopper-type unit converters so that the voltage command values and the actual voltages coincide with each other as much as possible.

A DC failure detection unit changes a DC failure detection signal from 0 to 1 after a certain time period has elapsed since detection of DC failure. At this time, the DC failure detection unit changes the DC failure detection signal from 0 to 1 in a ramp function shape with a certain slope. The DC failure detection signal is given to the above command distributing unit. Along with change of the DC failure detection signal, the command value distributing unit returns the output voltage command value for the bidirectional chopper group and the output voltage command value for the full-bridge group, to the waveforms similar to those at the time of occurrence of DC failure (see, for example, Patent Document 1).

CITATION LIST

Patent Document

Patent Document 1: Japanese Laid-Open Patent Publication No. 2013-121223 (page 3, paragraphs [0082] to [0134], FIG. 1 to FIG. 6)

SUMMARY OF THE INVENTION

Problems to be Solved by the Invention

In the conventional power conversion device as described above, at the time of restarting after a certain time period has elapsed since detection of DC line short-circuit, the failure detection signal is changed from 0 to 1 with a slope. All the semiconductor switching elements included in the bidirectional-chopper-type unit converters and the full-bridge-type unit converters are subjected to switching so that the DC output voltage follows the change of the failure detection signal while AC voltage is outputted.

After the DC lines are short-circuited, it is required to swiftly restore the DC voltage of the DC lines to a desired voltage value and start power transmission. However, at the beginning of restart of the power conversion device, current flowing through each phase arm is small. Therefore, by influence of noise due to ON/OFF switching of such many semiconductor switching elements, the polarity of DC current flowing through each phase arm can change. As a result, variations occur in the voltages of the DC capacitors in the converter cells, and each converter cell sometimes cannot perform output in accordance with the voltage command value. Thus, there is a problem that the voltage of the DC lines cannot be swiftly raised in accordance with the DC voltage command value and the power conversion device cannot be restarted accurately.

The present invention has been made to solve the above problem, and an object of the present invention is to provide a power conversion device and a power system that enable accurate restart of the power conversion device.

Solution to the Problems

A power conversion device according to the present invention includes: a power converter including a plurality of phase arms in which a first arm and a second arm for each of phases are connected in series to each other, the plurality of phase arms being connected in parallel between positive and negative DC lines, the power converter performing power conversion between three-phase AC and DC; and a control device which generates respective voltage command values for the first arm and the second arm and performs drive-control of the power converter on the basis of the voltage command values. The first arm and the second arm each include a converter cell composed of: a first series body having semiconductor switching elements in both of upper and lower arms; and a DC capacitor connected in parallel to the first series body. The converter cell in the second arm is a second converter cell formed by connecting the DC capacitor, the first series body, and a second series body in parallel, the second series body having a semiconductor switching element in one of upper and lower arms and a diode in the other one, the second converter cell being configured to output positive-polarity and negative-polarity voltages corresponding to a magnitude of both-end voltage of the DC capacitor. When short-circuit between the DC lines is detected, the control device performs protection control to turn off the semiconductor switching elements in the power converter, and when elimination of the short-circuit between the DC lines is detected, the control device performs restart control of the power converter by giving a voltage command value for causing negative-polarity current flowing through the diode to flow to the phase arm, to each converter cell in the first arm and the second arm.

A power system according to the present invention includes a plurality of the power conversion devices configured as described above, wherein the DC lines of the power converters of the power conversion devices are connected to each other.

Effect of the Invention

The power conversion device according to the present invention reduces noise due to ON/OFF switching of the semiconductor switching elements at the time of restart of the power conversion device. Thus, the power conversion device and the power system including the power conversion device can be restarted accurately.

DESCRIPTION OF EMBODIMENTS

Embodiment 1

Hereinafter, a power conversion device 100 according to embodiment 1 of the present invention will be described with reference to the drawings.

Figure 1:
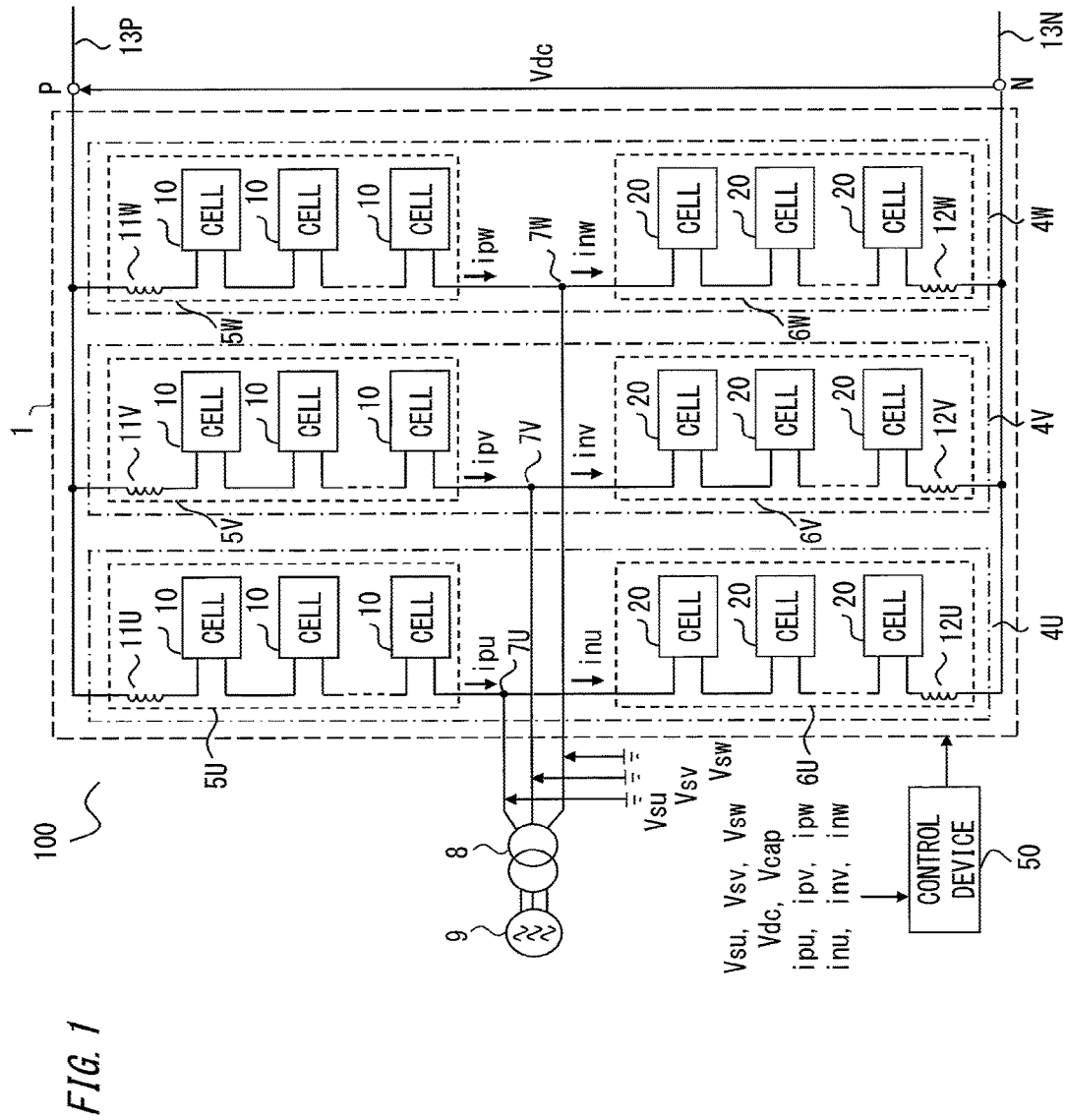
FIG. 1 is a schematic configuration diagram of a power conversion device according to embodiment 1 of the present invention.

FIG. 1 is a schematic configuration diagram of a power conversion device 100 according to embodiment 1 of the present invention.

Figure 2:
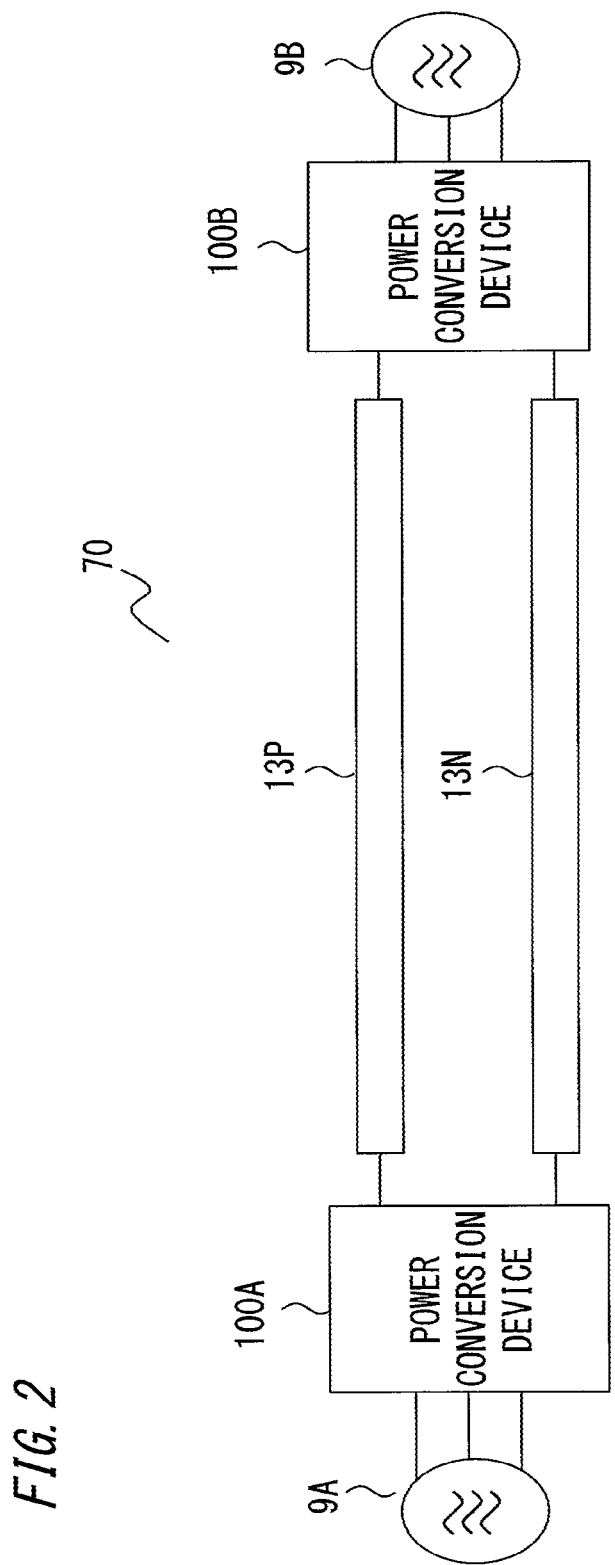
FIG. 2 is a schematic configuration diagram of a two-terminal HVDC system according to embodiment 1 of the present invention.

FIG. 2 is a schematic configuration diagram of a two-terminal HVDC system configured using a plurality of the power conversion devices 100 according to embodiment 1 of the present invention. In FIG. 2, the power conversion devices 100 of the present embodiment are denoted by 100A and 100B.

The power conversion device 100 performs power conversion between DC and AC. As shown in FIG. 2, the AC sides of the power conversion devices 100A, 100B are respectively connected to three-phase AC power supplies 9A, 9B which are AC grids. The DC sides of the power conversion devices 100A, 100B are connected to a DC grid formed by positive and negative DC lines 13P, 13N. Thus, a two-terminal high-voltage DC (HVDC: High Voltage Direct Current) system is formed as a power system that allows high-voltage DC power to be passed and received between the power conversion devices 100A, 100B.

As shown in FIG. 1, the power conversion device 100 includes a power converter 1 which is a main circuit, and a control device 50 for controlling the power converter 1. As described above, the AC side of the power converter 1 is connected to the three-phase AC power supply 9 via an interconnection transformer 8, and the DC side thereof is connected to the positive and negative DC lines 13P, 13N via DC terminals P, N.

The phases of the power converter 1 are formed by phase arms (phase arms 4U, 4V, 4W). The plurality of phase arms 4U, 4V, 4W are formed by respectively connecting, in series, first arms 5U, 5V, 5W connected to the positive DC line 13P and second arms 6U, 6V, 6W connected to the negative DC line 13N. AC terminals 7U, 7V, 7W which are connection points between the first arms 5U, 5V, 5W and the second arms 6U, 6V, 6W are connected to AC lines for the respective phases. These three phase arms 4U, 4V, 4W are connected in parallel between the positive and negative DC lines 13P, 13N.

The first arms 5U, 5V, 5W and the second arms 6U, 6V, 6W are each formed by a cell group including one or more converter cells (first converter cells 10, second converter cells 20) connected in series. Reactors 11U, 11V, 11W are connected in series to the first arms 5U, 5V, 5W. Reactors 12U, 12V, 12W are connected in series to the second arms 6U, 6V, 6W.

In the following description, unless the phases U, V, W are discriminated, reference is made as the first arm 5, the second arm 6, the phase arm 4, the reactor 11, the reactor 12, and an AC terminal 7.

It is noted that the positions where the reactor 11 and the reactor 12 are provided may be any positions in the first arm 5 and the second arm 6. For example, the reactor 11 and the reactor 12 may be collectively provided on only one of the first arm 5 side and the second arm 6 side.

A configuration example of each converter cell composing the first arm 5 and the second arm 6 will be described with reference to the drawings.

Figure 3:
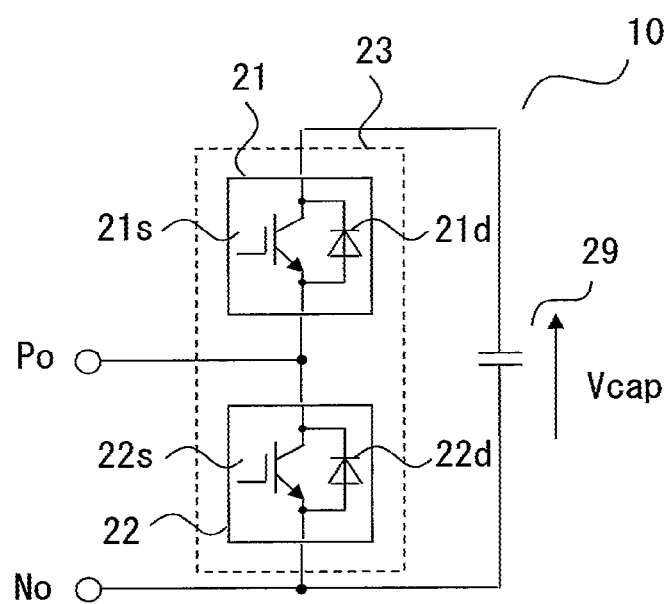
FIG. 3 is a configuration diagram of a first converter cell according to embodiment 1 of the present invention.

FIG. 3 is a configuration diagram of the first converter cell 10 having a half-bridge configuration and used for the first arm 5, according to embodiment 1 of the present invention.

The first converter cell 10 is composed of a first series body 23 and a DC capacitor 29 connected in parallel to the first series body 23. The first series body 23 has, in respective upper and lower arms, a plurality of (in this case, two) semiconductor switching elements 21s, 22s (hereinafter, simply referred to as switching elements) to which diodes 21d, 22d are connected in antiparallel. The DC capacitor 29 smooths DC voltage.

The switching elements 21s, 22s are each formed from a self-turn-off switching element such as IGBT (Insulated Gate Bipolar Transistor) or GCT (Gate Commutated Turn-off thyristor), and diodes 21d, 22d are respectively connected in antiparallel thereto, to form switches 21, 22.

In the first converter cell 10, both terminals of the switching element 22s of the switch 22 are used as output ends, and the switching elements 21s, 22s are switched on/off. Thus, from the output ends, both-end voltage of the DC capacitor 29, and zero voltage in a state in which input/output terminals are short-circuited, are outputted.

Figure 4:
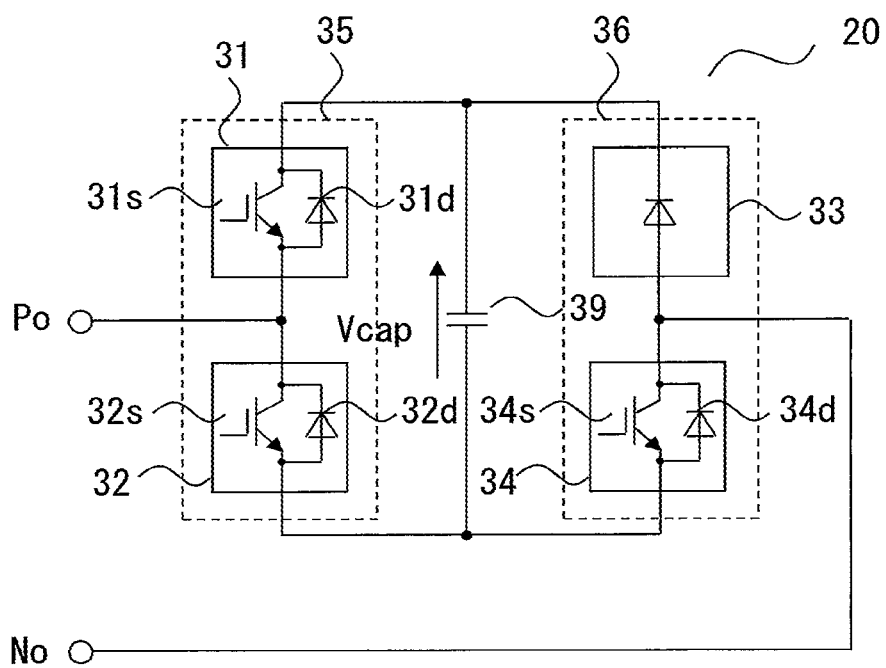
FIG. 4 is a configuration diagram of a second converter cell according to embodiment 1 of the present invention.

FIG. 4 shows the configuration of the second converter cell 20 used for the second arm 6 according to embodiment 1 of the present invention.

The second converter cell 20 is composed of a first series body 35, a second series body 36 connected in parallel to the first series body, and a DC capacitor 39 for smoothing DC voltage.

The first series body 35 has, in respective upper and lower arms, a plurality of (in this case, two) switching elements 31s, 32s to which diodes 31d, 32d are connected in antiparallel. The second series body 36 is configured such that one of upper and lower arms has a diode 33, and in the other arm, a switching element 34s to which a diode 34d is connected in antiparallel is connected in series. In the present embodiment, the diode 33 is provided in the upper arm.

The switching elements 31s, 32s, 34s are each formed from a self-turn-off switching element such as IGBT or GCT, and the diodes 31d, 32d, 34d are connected in antiparallel thereto, to form switches 31, 32, 34.

In the second converter cell 20, the connection point between the switching elements 31s, 32s and the connection point between the diode 33 and the switching element 34s, which are the respective intermediate connection points of the first series body 35 and the second series body 36, are used as output ends, and the switching elements 31s, 32s, 34s are switched on/off. Thus, from the output ends, same-polarity positive voltage almost equal to the magnitude of both-end voltage of the DC capacitor 39, opposite-polarity negative voltage almost equal to the magnitude of the both-end voltage, and zero voltage in a state in which input/output terminals are short-circuited, are outputted. It is noted that the negative-polarity voltage can be outputted under the condition that current passing through the second converter cell 20 flows from an input/output terminal No to an input/output terminal Po, the switching element 32s is ON, and the switching elements 31s, 34s are OFF.

It is noted that the first converter cell 10 is not limited to the configuration shown in FIG. 3 as long as the first converter cell 10 is composed of a series body formed by switching elements, and a DC capacitor connected in parallel to the series body, and is configured to selectively output the voltage of the series capacitor through switching operation.

In addition, the second converter cell 20 is not limited to the configuration shown in FIG. 4 as long as the second converter cell 20 is composed of a series body formed by a switching element and a diode, and a DC capacitor connected in parallel to the series body, and is configured to selectively output the voltage of the series capacitor through switching operation.

As described above, all the converter cells composing the first arm 5 of the power converter 1 are the first converter cells 10 which have a half-bridge configuration and are capable of outputting positive voltage between both ends of the DC capacitor 29 and zero voltage. In addition, all the converter cells composing the second arm 6 of the power converter 1 are the second converter cells 20 which are capable of outputting positive voltage/negative voltage between both ends of the DC capacitor 39 and zero voltage.

First arm currents ipu, ipv, ipw and second arm currents inu, inv, inw flowing through the first arms 5U, 5V, 5W and the second arms 6U, 6V, 6W of the power converter 1 are detected by current detectors (not shown) and then inputted to the control device 50.

Further, phase voltages Vsu, Vsv, Vsw of the three-phase AC power supply 9, DC voltage Vdc between the DC terminals P and N, and DC capacitor voltages Vcap of the first converter cell 10 and the second converter cell 20, are detected by voltage detectors (not shown) and then inputted to the control device 50.

It is noted that, regarding DC current and AC current for each phase, values calculated from the first arm currents ipu, ipv, ipw and the second arm currents inu, inv, inw flowing through the first arms 5U, 5V, 5W and the second arms 6U, 6V, 6W for the respective phases may be used.

Figure 5:
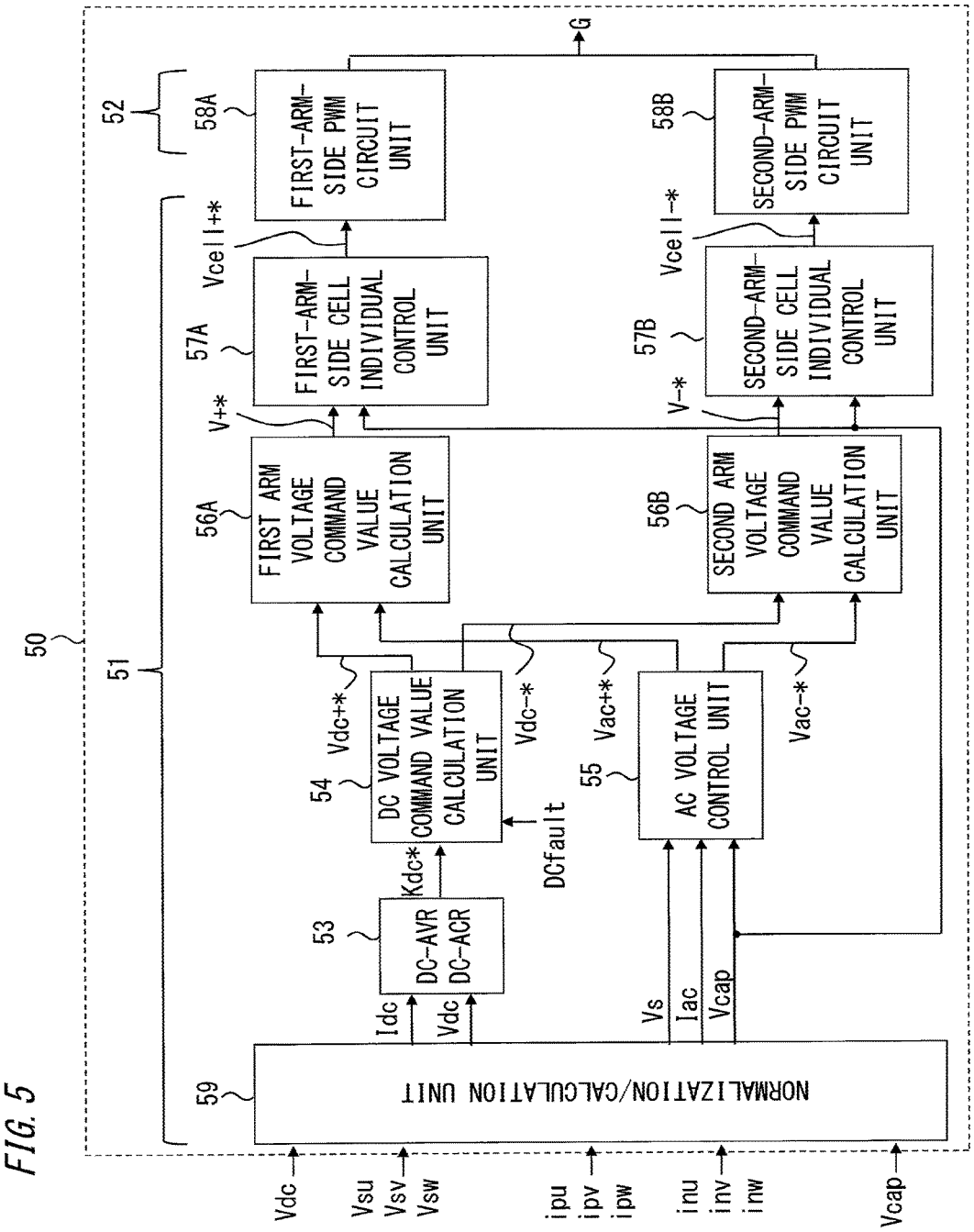
FIG. 5 is a block diagram showing a configuration example of a control device according to embodiment 1 of the present invention.

FIG. 5 is a block diagram showing a configuration example of the control device 50 in the power conversion device 100 according to embodiment 1 of the present invention.

The control device 50 includes a voltage command value generation unit 51 and a PWM unit 52 formed from respective control systems. The control device 50 generates voltage command values V+*, V−* for the first arm 5 and the second arm 6, and on the basis of the voltage command values V+*, V−*, generates gate signals G for performing PWM control of the first converter cells 10 and the second converter cells 20, thereby controlling the power converter 1.

First, the configuration of the voltage command value generation unit 51 will be described.

The voltage command value generation unit 51 includes a normalization/calculation unit 59, a DC-AVR (Direct Current-Automatic Voltage Regulator)/DC-ACR (Direct Current-Automatic Current Regulator) control unit 53, a DC voltage command value calculation unit 54, an AC voltage control unit 55, a first arm voltage command value calculation unit 56A, a second arm voltage command value calculation unit 56B, a first-arm-side cell individual control unit 57A, and a second-arm-side cell individual control unit 57B.

Hereinafter, the details of each component constituting the voltage command value generation unit 51 will be described.

The normalization/calculation unit (hereinafter, referred to as conversion unit 59) converts the detected first arm currents (ipu, ipv, ipw), second arm currents (inu, inv, inw), phase voltages (Vsu, Vsv, Vsw), DC voltage Vdc, and DC capacitor voltage Vcap, to signals for use in the control. The DC-AVR/DC-ACR control unit (hereinafter, referred to as DC control unit 53) generates a DC voltage command value Kdc* for controlling DC voltage Vdc, on the basis of DC current Idc and DC voltage Vdc obtained through conversion by the conversion unit 59. The DC voltage command value calculation unit 54 calculates a DC voltage command value Vdc+* for the first arm 5 and a DC voltage command value Vdc−* for the second arm 6, on the basis of the DC voltage command value Kdc* received from the DC control unit 53. The AC voltage control unit 55 generates AC voltage command values Vac+, Vac− for the first arm 5 and the second arm 6, on the basis of AC voltage Vs, AC current Iac, and DC capacitor voltage Vcap obtained through conversion by the conversion unit 59.

The first arm voltage command value calculation unit 56A calculates a voltage command value V+* for the first arm 5 on the basis of the DC voltage command value Vdc+* and the AC voltage command value Vac+* respectively calculated by the DC voltage command value calculation unit 54 and the AC voltage control unit 55.

Similarly, the second arm voltage command value calculation unit 56B calculates a voltage command value V−+* for the second arm 6 on the basis of the DC voltage command value Vdc−* and the AC voltage command value Vac−*.

The first-arm-side cell individual control unit 57A generates a first-arm-side cell voltage command value Vcell+* for controlling the voltage of each first converter cell 10 composing the first arm 5, on the basis of the voltage command value V+* calculated by the first arm voltage command value calculation unit 56A, and the DC capacitor voltage Vcap.

Similarly, the second-arm-side cell individual control unit 57B generates a second-arm-side cell voltage command value Vcell−* for controlling the voltage of each second converter cell 20 composing the second arm 6, on the basis of the voltage command value V−* and the DC capacitor voltage Vcap.

Next, the configuration of the PWM unit 52 will be described.

The PWM unit 52 includes a first-arm-side PWM circuit unit 58A and a second-arm-side PWM circuit unit 58B. The first-arm-side PWM circuit unit 58A and the second-arm-side PWM circuit unit 58B generate gate signals G for performing PWM control of each of the first converter cells 10 and the second converter cells 20 in the first arm 5 and the second arm 6 for each phase, on the basis of the first-arm-side cell voltage command value Vcell+* and the second-arm-side cell voltage command value Vcell−*.

By the generated gate signals G, the switching elements $21s$, $22s$ in the first converter cell 10 and the switching elements $31s$, $32s$, $34s$ in the second converter cell 20 are drive-controlled. Thus, the output voltage of the power converter 1 is controlled to be a desired value.

Here, the voltage command value V+* for the first arm 5 and the voltage command value V−* for the second arm 6 will be described.

As described above, the voltage command value V+* for the first arm 5 is determined in accordance with the DC voltage command value Vdc+* calculated by the DC voltage command value calculation unit 54 and the AC voltage command value Vac+* calculated by the AC voltage control unit 55. Similarly, the voltage command value V−* for the second arm 6 is determined in accordance with the DC voltage command value Vdc−* calculated by the DC voltage command value calculation unit 54 and the AC voltage command value Vac−* calculated by the AC voltage control unit 55. That is, the voltage command values V+*, V−* for the first arm 5 and the second arm 6 contain two components, i.e., a DC component and an AC component.

As described above, each converter cell in the first arm 5 is the first converter cell 10 which has a half-bridge configuration and is capable of outputting positive voltage and zero voltage. Therefore, a voltage command value to be given to the first converter cell 10 in the first arm 5 is limited within a positive region. That is, the DC voltage command value Vdc+* contained in the voltage command value V+* for the first arm 5 is limited to a positive value. In addition, the maximum amplitude of the AC voltage command value Vac+* contained in the voltage command value V+* for the first arm 5 depends on the DC voltage command value Vdc+*.

On the other hand, each converter cell in the second arm 6 is the second converter cell 20 which is capable of outputting positive voltage, negative voltage, and zero voltage as described above. Therefore, although depending on the polarity of current flowing in the second converter cell 20 in the second arm 6, a voltage command value to be given to the second converter cell 20 in the second arm 6 can have values in both positive and negative regions. That is, both positive and negative values can be selected for the DC voltage command value Vdc−* contained in the voltage command value V−* for the second arm 6. In addition, the AC voltage command value Vac−* contained in the voltage command value V−* for the second arm 6 is set to have a polarity opposite to the AC voltage command value Vac+* for the first arm 5.

Since the first arm 5 and the second arm 6 are connected in series, voltage almost equal to the sum of the voltage command value V+* for the first arm 5 and the voltage command value V−* for the second arm 6 is outputted between the DC terminals P and N. As described above, the AC voltage command value Vac+* for the first arm 5 and the AC voltage command value Vac−* for the second arm 6 have polarities opposite to each other and therefore are canceled out with each other. Thus, voltage almost equal to the sum of the DC voltage command value Vdc+* for the first arm 5 and the DC voltage command value Vdc−* for the second arm 6 is outputted between the DC terminals P and N. That is, voltage between the DC terminals P and N is outputted depending on the DC voltage command values Vdc+* and Vdc−* calculated by the DC voltage command value calculation unit 54.

Hereinafter, major matters of the present embodiment, i.e., protection control for suppressing short-circuit current is due to short-circuit between the DC lines 13P, 13N, and restart control of the power converter 1 after the short-circuit is eliminated, will be described with reference to the drawings.

Figure 6:
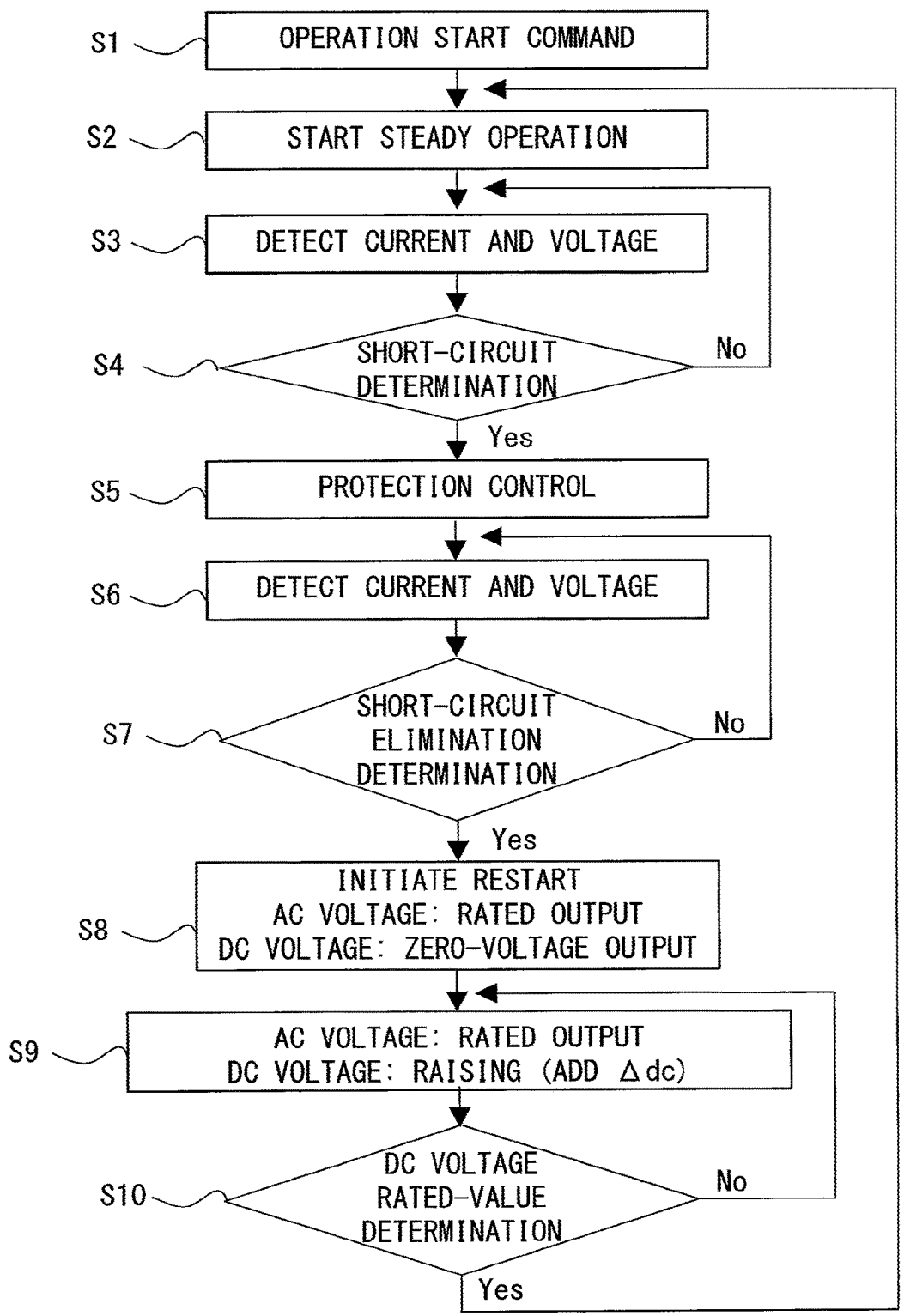
FIG. 6 is a flowchart showing control operation of the power conversion device according to embodiment 1 of the present invention.

FIG. 6 is a flowchart showing control operation of the power conversion device 100 according to embodiment 1 of the present invention.

Figure 7:
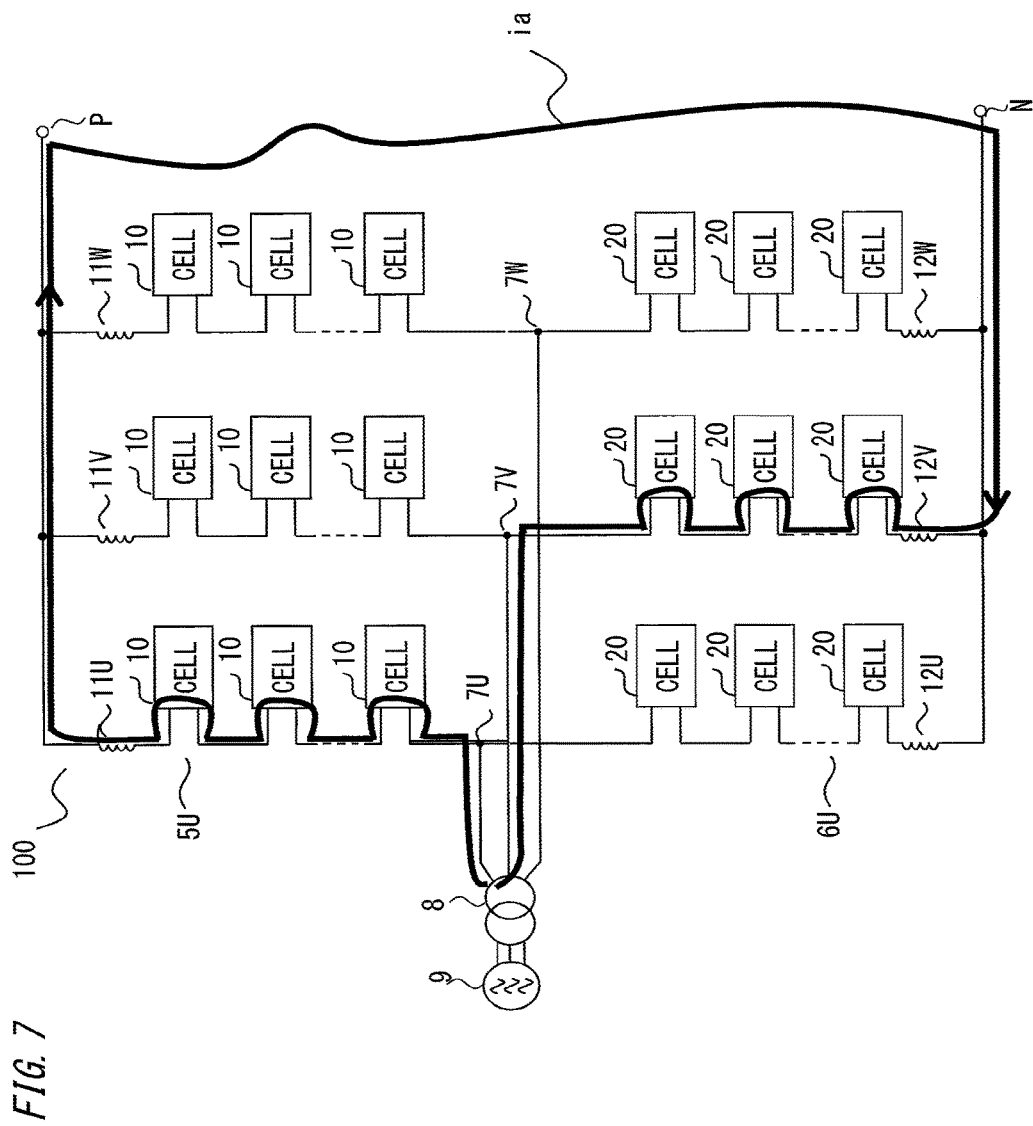
FIG. 7 shows a route of short-circuit current occurring by short-circuit between DC terminals.

FIG. 7 shows a route of short-circuit current is flowing when short-circuit occurs between the DC terminals P and N.

Figure 8:
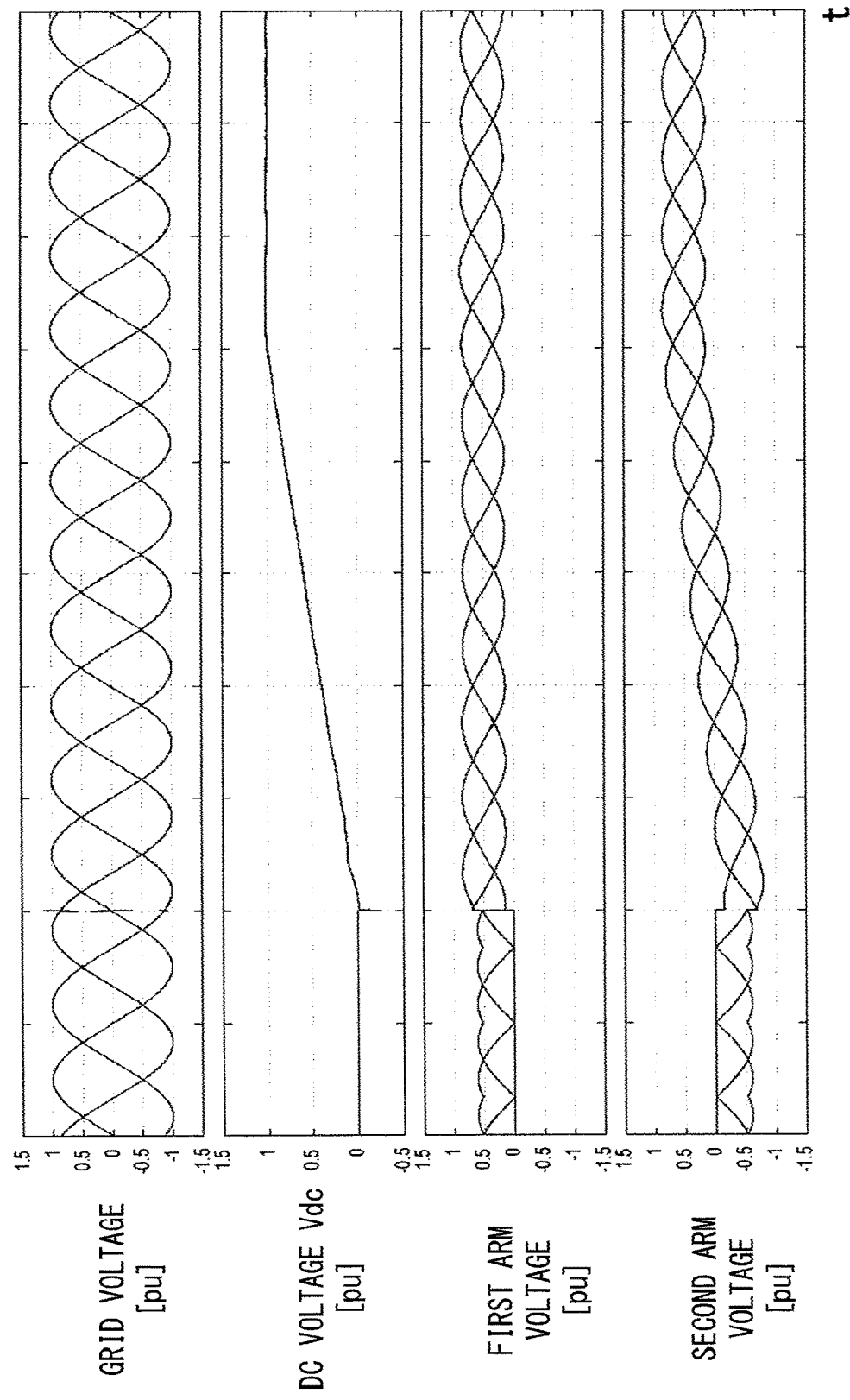
FIG. 8 is a waveform diagram showing the state of a power converter in restart control of the power converter according to embodiment 1 of the present invention.

FIG. 8 shows waveforms of AC grid voltage, DC voltage Vdc, voltage of the first arm 5, and voltage of the second arm 6 in restart control of the power converter 1 according to embodiment 1 of the present invention.

When an operation start command for the power converter 1 is given (step S1), the control device 50 sets the operation mode of the power converter 1 to steady control, to start steady operation of the power converter 1. That is, the control device 50 fixes the switching element 34s of the second series body 36 of each second converter cell 20 in the second arm 6, in an ON state. Then, the control device 50 causes the switching elements 21s, 22s, 31s, 32s in the first series bodies 23, 35 of each first converter cell 10 and each second converter cell 20 to perform steady operations (step S2).

Next, the control device 50 obtains DC current Idc flowing through the DC terminal P and DC voltage Vdc between the DC terminals P and N, by detection or calculation (step S3).

Next, the control device 50 determines whether or not short-circuit has occurred between the DC terminals P and N (DC lines 13P, 13N), on the basis of the DC current Idc and the DC voltage Vdc. For example, if the DC current Idc becomes overcurrent exceeding a set reference value and the DC voltage Vdc becomes almost zero, the control device 50 determines that short-circuit has occurred (step S4, Yes).

If it is determined in step S4 that short-circuit has not occurred (step S4, No), the process returns to step S3 and the control device 50 repeats the short-circuit determination periodically.

Next, if it is determined in step S4 that short-circuit has occurred between the DC terminals P and N, the control device 50 switches the operation mode of the power converter 1 from steady control to protection control, and the power converter 1 starts protection operation (step S5). That is, the control device 50 controls all the switching elements 21s, 22s, 31s, 32s, 34s in each first converter cell 10 and each second converter cell 20 into an OFF state, thereby suppressing the short-circuit current ia.

Suppression of the short-circuit current ia by protection control of turning off all the switching elements 21s, 22s, 31s, 32s, 34s as described above will be described.

As shown in FIG. 7, when short-circuit occurs between the DC terminals P and N, short-circuit current ia flows through a route indicated by an arrow in FIG. 7. Here, protection control of turning off all the switching elements 21s, 22s, 31s, 32s, 34s is performed. In the protection control, short-circuit current ia does not flow as long as the sum of the charge voltages of the DC capacitors 39 of the second converter cells 20 connected in the route of the short-circuit current ia is higher than voltage between the AC terminals 7. In the present embodiment, the number of the second converter cells 20 composing the second arm 6 is adjusted so as to satisfy the above condition, and therefore the short-circuit current ia can be suppressed.

In the present embodiment, the switching elements 21s, 22s of each first converter cell 10 having a half-bridge configuration in the first arm 5 are turned off, and this is for reducing the influence of the switching operations on the AC terminals 7 and does not contribute to suppression of the short-circuit current ia.

Next, in the protection operation control, the control device 50 obtains DC current Idc and DC voltage Vdc by detection or calculation (step S6).

Next, the control device 50 determines whether or not the short-circuit between the DC terminals P and N has been eliminated, on the basis of the DC current Idc and the DC voltage Vdc (step S7).

If it is determined in step S7 that the short-circuit state has continued (step S7, No), the process returns to step S6 and the control device 50 repeats the short-circuit elimination determination periodically.

Next, if it is determined in step S7 that the short-circuit between the DC terminals P and N has been eliminated, the control device 50 switches the operation mode of the power converter 1 to restart control, and the power converter 1 initiates restart operation (step S8).

At the initiation of the restart control, the control device 50 performs control so that rated AC voltage Vac is outputted to the AC terminals 7U, 7V, 7W and zero voltage is outputted between the DC terminals P and N.

As described above, the voltage between the DC terminals P and N has a value obtained by adding the voltage command value V+* for the first arm 5 and the voltage command value V−* for the second arm 6. Therefore, the power converter 1 can output zero voltage between the DC terminals P and N if the DC voltage command value Vdc+* for the first arm 5 and the DC voltage command value Vdc−* for the second arm 6 are DC voltage command values having magnitudes equal to each other and polarities opposite to each other. For example, +½Vdc is set as the DC voltage command value Vdc+* for the first arm 5, and −½Vdc is set as the DC voltage command value Vdc−* for the second arm 6.

That is, in order to output zero voltage between the DC terminals P and N while outputting rated AC voltage Vac to the AC terminals 7, a value (V+*=−Vac+½Vdc) obtained by adding a negative-polarity rated AC voltage command value −Vac and a positive-polarity rated DC voltage command value+½Vdc is set as the voltage command value V+* for the first arm 5. In addition, a value (V−*=+Vac−½Vdc) obtained by adding a positive-polarity rated AC voltage command value+Vac and a negative-polarity rated DC voltage command value −½Vdc is set as the voltage command value V−* for the second arm 6.

The control device 50 generates gate signals G based on the above voltage command values V+*, V−* and performs switching control of the switching elements 21s, 22s, 31s, 32s, 34 by PWM control. In this way, at the initiation of the restart control, the control device 50 outputs rated AC voltage Vac to the AC terminals 7 and outputs zero voltage between the DC terminals P and N.

Next, the control device 50 adds an adjustment voltage value Δdc which is a minute DC voltage value, to the DC voltage command value Vdc−* for the second arm 6, in the DC voltage command value calculation unit 54.

$$Vdc-*(t)=Vdc-*(t-\Delta t)+\Delta dc \quad \text{(step S9)}$$

Here, Δt is a cycle of addition of Δdc.

Thus, the voltage value of DC voltage Vdc outputted between the DC terminals P and N becomes a value obtained by multiplying the minute adjustment voltage value Δdc with the number n of times of addition of the adjustment voltage value Δdc.

$$Vdc[V]=\Delta dc[V]\times \text{number } n \text{ of times of addition}$$

In this way, the DC voltage command value Vdc−* for the second arm 6 is increased every addition cycle (Δt), so that the DC voltage command value Vdc−* for the second arm 6 gradually increases from the negative-polarity rated DC voltage command value (−½Vdc) to the Positive-Polarity rated DC voltage command value (+½Vdc). Thus, the DC voltage Vdc between the DC terminals P and N gradually increases so as to follow the voltage command values V+*, V−* which gradually increase in a ramp function shape from zero voltage to the rated voltage Vdc.

Next, the control device 50 obtains the DC voltage Vdc by detection, and on the basis of the DC voltage Vdc, determines whether or not the voltage between the DC terminals P and N has reached the rated value (step S10).

If it is determined in step S10 that the DC voltage Vdc has reached the rated value (step S10, Yes), the control device 50 switches the operation mode to steady control, to start power transmission (step S2).

If it is determined that the DC voltage Vdc has not reached the rated voltage (step S10, No), the process returns to step S9 to add Δdc to the DC voltage command value and then proceeds to step S10, whereby the rated value determination is repeated periodically.

In the present embodiment, as the converter cells composing the second arm 6, the second converter cells 20 capable of outputting negative-polarity voltage are used. Therefore, even if the voltage command value V−* for the second arm 6 as described above includes the negative-polarity rated DC voltage command value (−½Vdc), it is possible to perform output corresponding to this voltage command value V−*.

As described above, as a condition in which the second converter cell 20 can output negative-polarity voltage, it is necessary that current passing through the second converter cell 20 flows from the No side to the Po side, i.e., negative-polarity current in flows through the phase arm 4. Hereinafter, the reason why the negative-polarity current in can flow through the phase arm 4 will be described with reference to FIG. 9.

Figure 9:
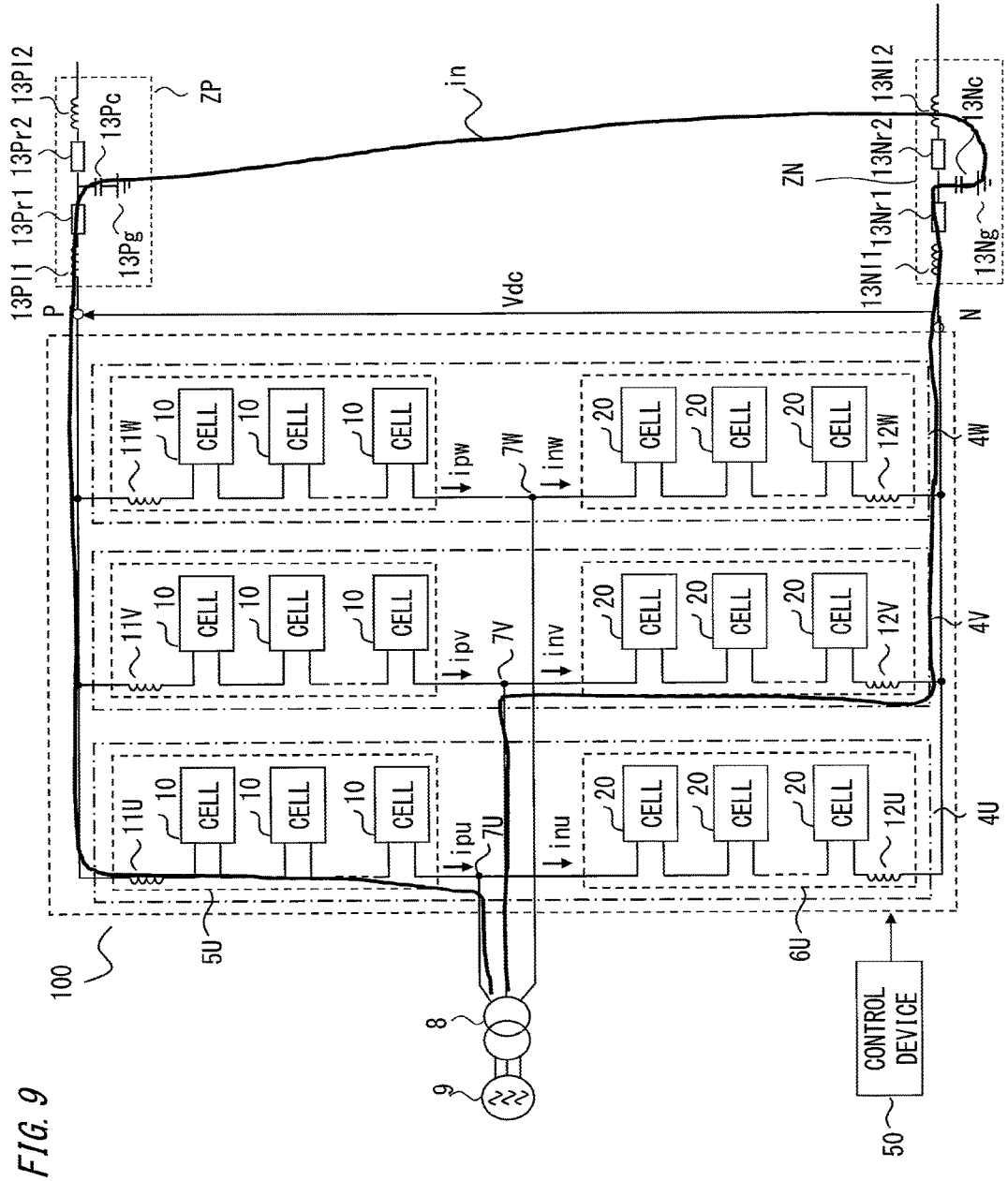
FIG. 9 shows a route of negative-polarity current in restart control of the power converter according to embodiment 1 of the present invention.

FIG. 9 shows a route of negative-polarity current in caused to flow in the power converter 1 in restart control of the power converter 1 according to embodiment 1 of the present invention.

A stray impedance ZP of the DC line 13P connected to the DC terminal P is represented by a reactor 13Pl1, a resistor 13Pr1, a resistor 13Pr2, a reactor 13Pl2, and a capacitor 13Pc, and a stray impedance ZN of the DC line 13N connected to the DC terminal N is represented by a reactor 13Nl1, a resistor 13Nr1, a resistor 13Nr2, a reactor 13Nl2, and a capacitor 13Nc.

The capacitors 13Pc, 13Nc which are stray capacitances are once discharged when short-circuit occurs between the DC terminals P and N. In addition, as described above, in the restart control, the control device 50 turns on the switching elements 32s and turns off the switching elements 31s, 34s in the second arm 6 so as to allow the second converter cell 20 to output negative-polarity voltage, i.e., so as to ensure a current route through which negative-polarity current in flows in the phase arm 4. Therefore, when the control device 50 applies DC voltage to the DC lines 13P, 13N, as shown in FIG. 9, the negative-polarity current in flows through: the reactor 13Pl1, the resistor 13Pr1, the capacitor 13Pc, and a ground 13Pg; a ground 13Ng, the capacitor 13Nc, the resistor 13Nr1, and the reactor 13Nl1 of the DC line 13N; and then the diode 33 and the switch 32 in each second converter cell 20. That is, the negative-polarity current in flows through each second arm 6 (in a direction from the second arm 6 to the first arm 5). Thus, the second converter cells 20 are enabled to output negative-polarity voltage in the restart control.

As described above, the control device 50 performs switching control of the second converter cells 20 so as to ensure a route through which the negative-polarity current in flows, using the impedances that the DC lines 13P, 13N have. In this way, DC voltage that gradually increases is outputted to the DC line 13P while the negative-polarity current in is caused to flow through the phase arm 4.

As described above, through step S1 to step S10, the control device 50 switches the operation mode from steady control to protection control when short-circuit between the DC terminals P and N is detected. Then, the control device 50 controls all the switching elements in the first converter cells 10 and the second converter cells 20 into an OFF state, thereby suppressing the short-circuit current ia.

Then, when elimination of the short-circuit between the DC terminals P and N is detected, the control device 50 switches the operation mode from protection control to restart control. Then, the control device 50 raises the voltage between the DC terminals P and N from zero to the rated value in a ramp function shape with a predetermined slope, while performing rated output to the AC grid.

In this way, in a state of being interconnected with the AC grid, the same AC voltage as in the case of steady control is outputted to the AC terminals 7, and meanwhile, DC voltage is outputted to the DC terminals in a ramp function shape from zero to the rated value, whereby the DC voltage is gradually raised. Therefore, it is possible to perform stable restart without causing overvoltage on the DC line 13P.

In the present embodiment, as each converter cell used in the second arm 6 and capable of outputting negative-polarity voltage, the second converter cell 20 having the diode 33 in the upper arm of the second series body 36 is used. Thus, the diode 33 is used, instead of a switching element, for the upper arm of the second series body 36 which is used as a route through which negative-polarity current in flows in the second converter cell 20, whereby noise at the time of driving switching elements is reduced. Therefore, even in the case where the negative-polarity current in flowing through the phase arm 4 is small at the beginning of the restart control of the power converter 1, change in the polarity of the negative-polarity current in due to noise of switching elements can be suppressed.

Thus, variations in the voltages of the DC capacitors in the second converter cells 20 can be suppressed, whereby it becomes possible to perform output in accordance with the voltage command value for the second converter cells 20. Thus, it becomes possible to swiftly raise the DC voltage Vdc of the DC line 13P in accordance with the DC voltage command value Vdc+.

In the power conversion device 100 of the present embodiment configured as described above, in the restart control of the power converter 1, the control device 50 controls the switching elements 31s, 32s, 34s in each second converter cell 20 so as to ensure a route for negative-polarity current in flowing through each diode 33 in the phase arm 4. Thus, voltage is applied to the DC lines 13P, 13N and negative-polarity current in flows to the phase arm 4 in the power converter 1 via the stray impedances ZP, ZN. Therefore, a converter cell having a diode in one of upper and lower arms can be used for the power converter 1. As a result, as compared to the case of using a converter cell having switching elements in both of upper and lower arms, it is possible to decrease the number of switching elements used in the current route through which the negative-polarity current in flows. Thus, noise due to switching control of switching elements is reduced and change in the polarity of the negative-polarity current in is suppressed, whereby the power converter 1 of the power conversion device 100 can be accurately restarted. Thus, it becomes possible to swiftly start up the power converter 1 in accordance with the voltage command value.

Thus, rated DC voltage Vdc is swiftly applied to the DC lines 13P, 13N, and the high-voltage direct current (HVDC) system can be operated in a more stable manner.

Since a diode is used in the upper arm instead of using a switching element, the control load for the switching control in the control device 50 can be reduced.

In the first arm 5, the first converter cells 10 having a half-bridge configuration are used, and in the second arm 6, the second converter cells 20 are used. Then, the number of the second converter cells 20, the capacitances of the DC capacitors, and the like are adjusted in order that short-circuit current ia can be suppressed by only the second converter cells 20 in the second arm 6. As a result, the converter cells in the first arm 5 do not need to have a function of suppressing the short-circuit current ia, and therefore the first arm 5 can be formed by only the first converter cells 10 having a half-bridge configuration. Thus, the number of semiconductor switching elements used in the power converter 1 is decreased, the device configuration is downsized, and the cost can be reduced.

In the above description, the first arm 5 is connected to the positive DC line 13P, and the second arm 6 is connected to the negative DC line 13N. However, without limitation to this configuration, the first arm 5 may be connected to the negative DC line 13N, and the second arm 6 may be connected to the positive DC line 13P. That is, the second converter cells 20 capable of outputting the opposite-polarity voltage may be used for the arm connected to the positive DC line 13P, and the first converter cells 10 having a half-bridge configuration may be used for the arm connected to the negative DC line 13N.

The first arm 5 and the second arm 6 may be both formed by only the second converter cells 20 without using the first converter cells 10 having a half-bridge configuration.

The first arm 5 may be formed by the first converter cells 10 and the second converter cells 20 in a mixed manner. In this case, the number of the second converter cells 20 provided in the first arm 5 may be determined so that the second converter cells 20 the number of which enables suppression of the short-circuit current ia exist in the route of the short-circuit current ia.

In the above second converter cell 20, an example in which a diode is provided in the upper arm of the second series body 36 has been shown. However, a diode may be provided in the lower arm. In this case, the input/output terminals Po and No of the second converter cell 20 are reversed to each other.

In the power conversion device 100 shown in FIG. 1, the AC terminals 7U, 7V, 7W which are the connection points between the first arms 5U, 5V, 5W and the second arms 6U, 6V, 6W are directly connected to the respective phase AC lines, whereby power is passed and received to and from the three-phase AC power supply 9. However, the power conversion device 100 is not limited to the above configuration.

For example, the following configuration may be employed: the first arm 5 and the second arm 6 are connected in series via a primary winding of a transformer and then connected to the respective phase AC lines via a secondary winding of the transformer, whereby power is passed and received to and from the three-phase AC power supply 9.

As the second converter cell used for the second arm 6, a second converter cell 20a having the following configuration may be used.

Figure 10:
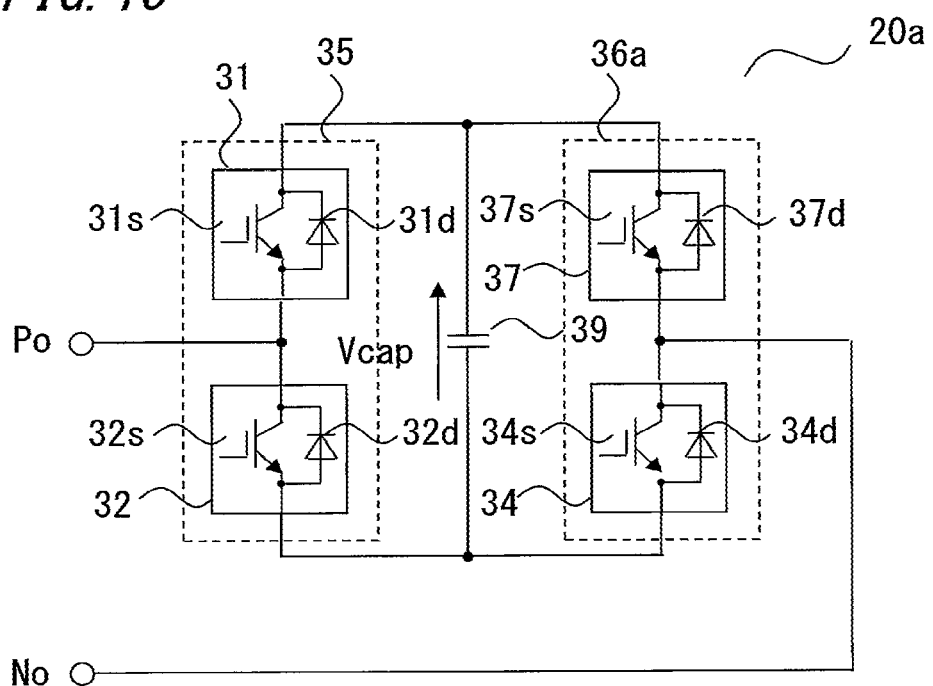
FIG. 10 is a configuration diagram showing another example of a second converter cell according to embodiment 1 of the present invention.

FIG. 10 shows the second converter cell 20a having a configuration different from the second converter cell 20 according to the present embodiment 1.

As shown in FIG. 10, a switching element 37s to which a diode 37d is connected in antiparallel is provided in an upper arm of a second series body 36a. The switching element 37s is formed from a self-turn-off switching element such as IGBT or GCT, and the diode 37d is connected in antiparallel thereto, to form a switch 37.

In the second converter cell 20a, terminals at the connection point between the switching elements 31s, 32s and the connection point between the switching elements 37s, 34s, which are intermediate connection points of the first series body 35 and 36a, are used as output ends. The control device 50 performs switching of the switching elements 31s, 32s, 37s, 34s, thereby outputting, from the output ends, same-polarity positive voltage almost equal to the magnitude of both-end voltage of the DC capacitor 39, opposite-polarity negative voltage almost equal to the magnitude of the both-end voltage, and zero voltage in a state in which the output terminals are short-circuited with an element.

Control by the control device 50 in the case of using such second converter cells 20a will be described.

In protection control, the control device 50 controls all the switching elements 31s, 32s, 37s, 34s in each second converter cell 20a into an OFF state, thereby suppressing short-circuit current ia.

Then, in restart control, the control device 50 fixes the switching element 37s in an OFF state, to ensure a route for negative-polarity current in to flow through the flyback diode 37d and the switch 32. By the switching element 37 being fixed in an OFF state as described above, noise due to switching control of the switching elements in the route through which the negative-polarity current in flows can be reduced.

Also in steady control, the control device 50 may fix the switching element 37s in an OFF state and perform switching control of the switching elements 31s, 32s, 34s. In this case, since the switching element 37s is always fixed in an OFF state, a small-sized switching element 37s having a small rated current can be used, and deterioration of the switching element 37s can be prevented.

In the above description, at the initiation of the restart control, the control device 50 provides the second arm 6 with the voltage command value V+* including a rated AC voltage command value and a voltage command value that gradually increases from a negative-polarity rated DC voltage command value to a positive-polarity rated DC voltage command value. In addition, at the initiation of the restart control, the control device 50 provides the first arm 5 with a rated AC voltage command value and a positive-polarity rated DC voltage command value. Thus, the DC voltage Vdc changes in a range of "0 V to rated voltage V".

However, the change range of the DC voltage Vdc is not limited to the above range. For example, it is also possible to perform fine adjustment so as to raise the DC voltage Vdc to a predetermined voltage value lower than the rated voltage value, by adjusting the DC voltage command value.

Embodiment 2

Hereinafter, with reference to the drawings, embodiment 2 of the present invention will be described focusing on difference from the above embodiment 1. The same parts as those in the above embodiment 1 are denoted by the same reference characters and the description thereof is omitted.

Figure 11:
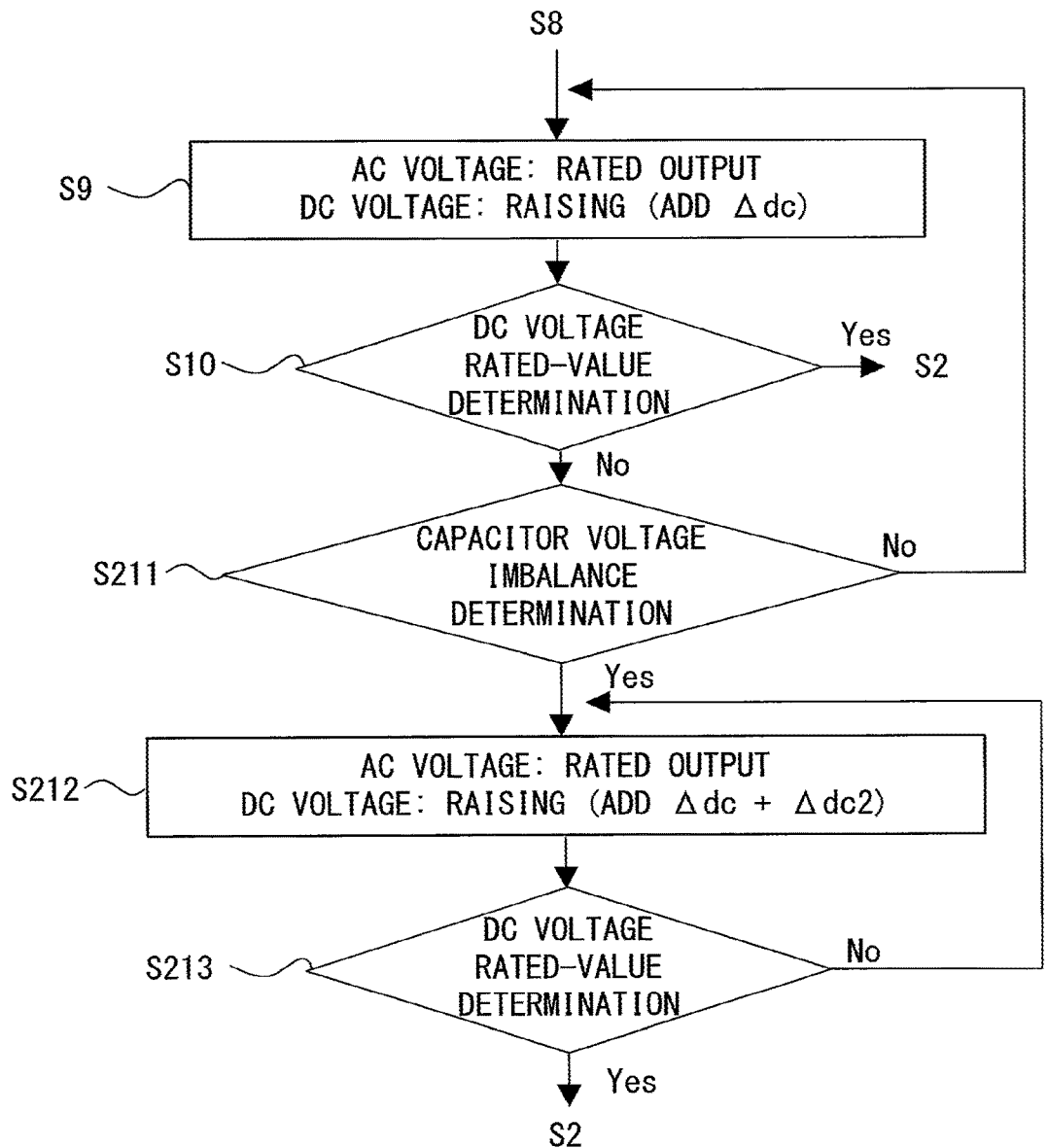
FIG. 11 is a flowchart showing control operation of a power conversion device according to embodiment 2 of the present invention.

FIG. 11 is a flowchart showing control operation of a power conversion device according to embodiment 2.

The same control operation as that in steps S1 to S10 described in embodiment 1 is performed also in the present embodiment, and for convenience sake, steps S1 to S8 of this control operation are not shown in the drawing.

As shown in FIG. 11, the present embodiment is different from embodiment 1 in that step S211, step S212, and step S213 are newly provided subsequently to step S9 and step S10 described in embodiment 1.

Through step S1 to step S10 described in embodiment 1, the control device 50 adds the adjustment voltage value $\Delta$dc which is a minute DC voltage value, to the DC voltage command value Vdc−* for the second arm 6, thereby raising the DC voltage Vdc. Then, the control device 50 determines whether or not the DC voltage Vdc between the DC terminals P and N has reached the rated value.

At the beginning of restart of the power converter 1, current flowing through the phase arm 4 is small, and the negative-polarity current in might not always flow through the phase arm 4 because of noise such as harmonics. That is, there is a period in which the second converter cells 20 of the second arm 6 cannot output negative voltage, and thus variations sometimes occur in the voltages Vcap of the DC capacitors 29, 39 in the power converter 1 because output according to the voltage command value cannot be performed. In such a case, the DC voltage Vdc might not reach the rated value.

Accordingly, in the case where the DC voltage Vdc does not reach the rated voltage in step S10 (step S10, No), the control device 50 detects the voltage Vcap of each DC capacitor 29, 39 in the power converter 1 and determines whether or not the voltage Vcap is out of a predetermined voltage value range (step S211).

For example, if the voltage Vcap becomes greater than a set upper limit value or smaller than a set lower limit value, it is determined that the voltages Vcap of the DC capacitors 29, 39 are unbalanced (S211, Yes).

If imbalance of the voltages Vcap of the DC capacitors 29, 39 is detected, the control device 50 further adds a minute adjustment voltage $\Delta$dc2 to the voltage command value V−* for the second arm 6, in addition to the aforementioned adjustment voltage value $\Delta$dc, in the DC voltage command value calculation unit 54 (Vdc−*(t)=Vdc−*(t−$\Delta$t)+$\Delta$dc+$\Delta$dc2) (step S212).

If the control device 50 does not detect imbalance of the voltages Vcap of the DC capacitors 29, 39 (step S211, No), the process returns to step S9.

As described above, if the control device 50 detects imbalance of the voltages Vcap of the DC capacitors 29, 39, the control device 50 further adds a minute adjustment voltage $\Delta$dc2 to the voltage command value V−* for the second arm 6, in addition to the adjustment voltage value $\Delta$dc. Thus, the speed of gradual increase of the DC voltage Vdc on the DC line 13P becomes faster than the speed of gradual increase at the time of the imbalance detection, whereby a time period required for restart of the power converter 1 is shortened. In this way, the DC voltage Vdc of the DC line 13P is raised immediately and the negative-polarity current in is increased immediately, whereby influence of noise on the negative-polarity current in is suppressed.

Next, as in embodiment 1, the control device 50 obtains the DC voltage Vdc by detection, and on the basis of the DC voltage Vdc, determines whether or not the voltage between the DC terminals P and N has reached the rated value (step S213).

If it is determined that the DC voltage Vdc has not reached the rated voltage (step S213, No), the process returns to step S212 to add the adjustment voltage value $\Delta$dc and the adjustment voltage value $\Delta$dc2 to the DC voltage command value, and the rated value determination is repeated periodically.

The power conversion device of the present embodiment 2 configured as described above provides the same effects as in the above embodiment 1, and thus it becomes possible to swiftly start up the power converter 1 in accordance with the voltage command value.

In addition, in the case where imbalance of the voltages Vcap of the DC capacitors 29, 39 is detected, a time period required for restart of the power converter 1 is shortened, and imbalance of the voltages Vcap of the DC capacitors 29, 39 is suppressed. As a result, the effect of starting up the power converter 1 in accordance with the voltage command value is improved and it becomes possible to perform stable restart.

In the restart control, the adjustment voltage value $\Delta$dc and the adjustment voltage value $\Delta$dc2 to be added to the DC voltage command value Vdc+ can be set to any values within such a range as not to cause overvoltage on the DC line 13P.

Embodiment 3

Hereinafter, with reference to the drawings, embodiment 3 of the present invention will be described focusing on difference from the above embodiment 1. The same parts as those in the above embodiment 1 are denoted by the same reference characters and the description thereof is omitted.

Figure 12:
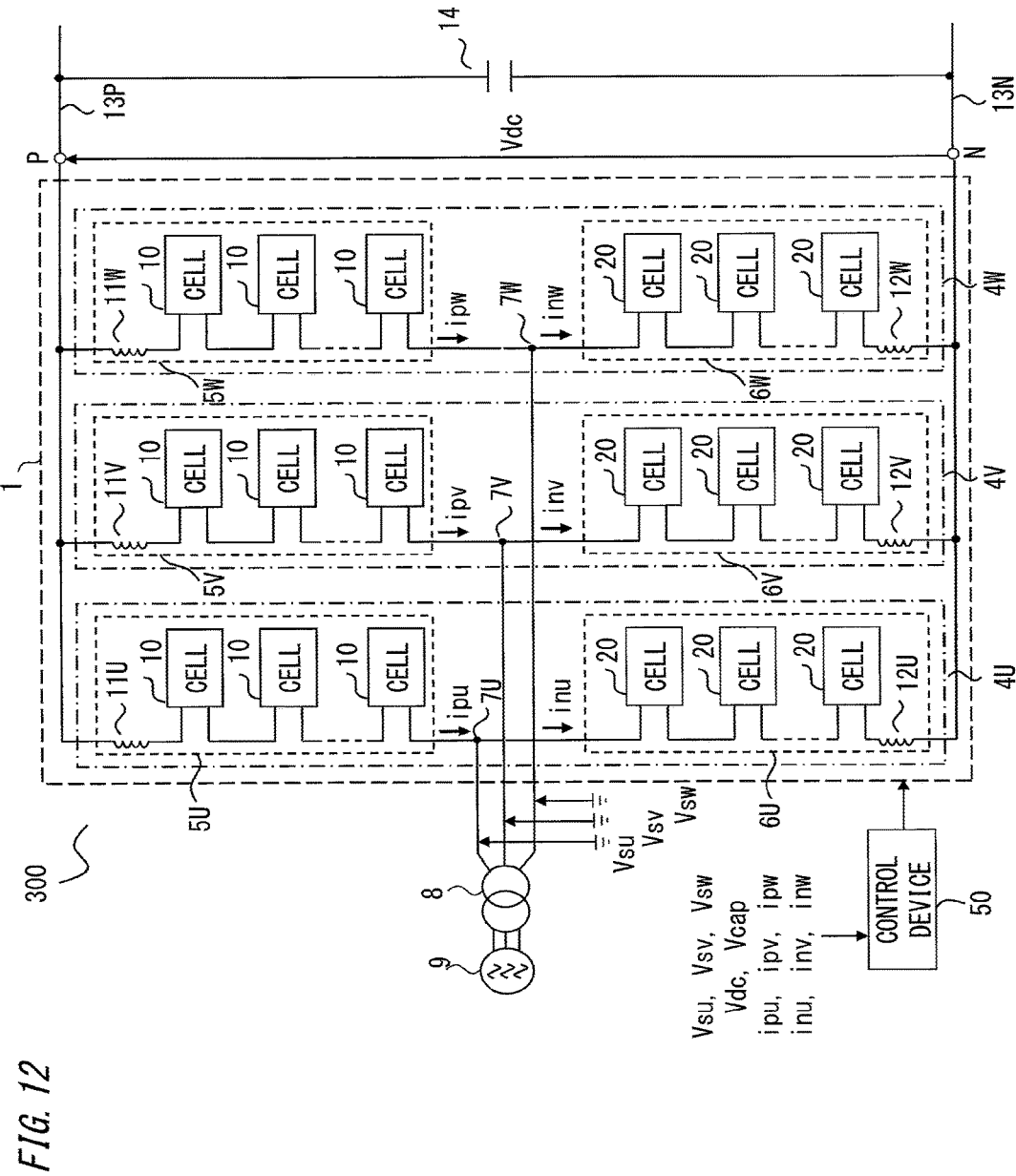
FIG. 12 is a schematic configuration diagram of a power conversion device according to embodiment 3 of the present invention.

FIG. 12 is a schematic configuration diagram of a power conversion device 300 according to embodiment 3 of the present invention.

As shown in FIG. 12, the present embodiment is different from embodiment 1 in that, as the impedance between the DC lines 13P, 13N, a capacitance 14 is connected between the DC lines 13P, 13N.

In embodiment 1, negative-polarity current in is caused to flow through the phase arm 4 of the power converter 1, using the stray impedances ZP, ZN that the DC lines 13P, 13N have. In the present embodiment, the capacitance 14 for causing the negative-polarity current in to flow is connected between the DC lines 13P, 13N.

Thus, it becomes possible to reliably ensure a route through which the negative-polarity current in flows.

The power conversion device of the present embodiment 3 configured as described above provides the same effects as in the above embodiment 1, and thus it becomes possible to swiftly start up the power converter 1 in accordance with the voltage command value.

Further, since the route through which the negative-polarity current in flows in restart control of the power converter 1 is reliably ensured, the effect of raising the DC voltage in accordance with the voltage command value is improved and it becomes possible to perform stable restart.

The value of the capacitance 14 may be determined on the basis of the speed of gradual increase of the DC voltage Vdc on the DC line 13P in the restart control.

Embodiment 4

Hereinafter, with reference to the drawings, embodiment 4 of the present invention will be described focusing on difference from the above embodiment 1. The same parts as those in the above embodiment 1 are denoted by the same reference characters and the description thereof is omitted.

Figure 13:
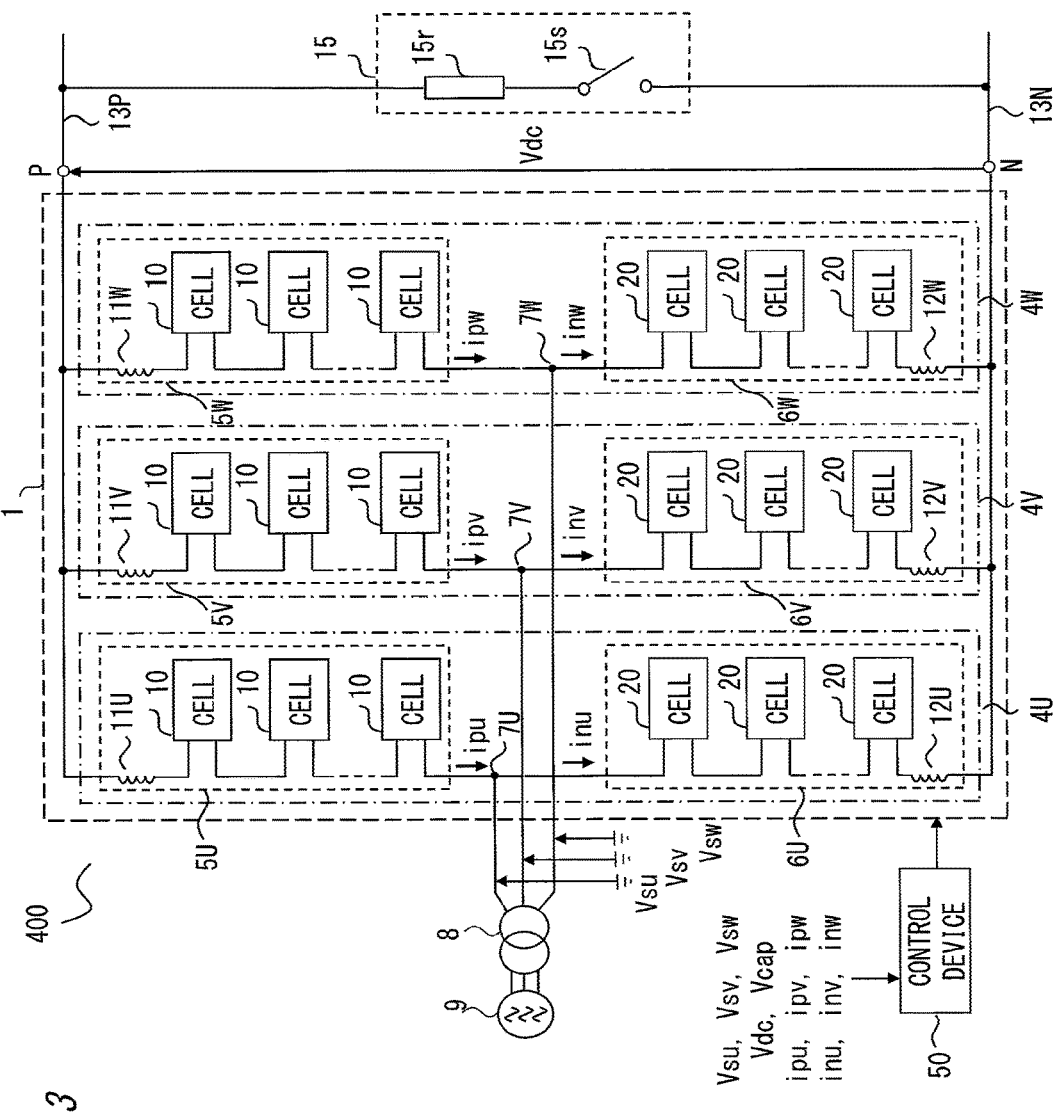
FIG. 13 is a schematic configuration diagram of a power conversion device according to embodiment 4 of the present invention.

FIG. 13 is a schematic configuration diagram of a power conversion device 400 according to embodiment 4 of the present invention.

Figure 14:
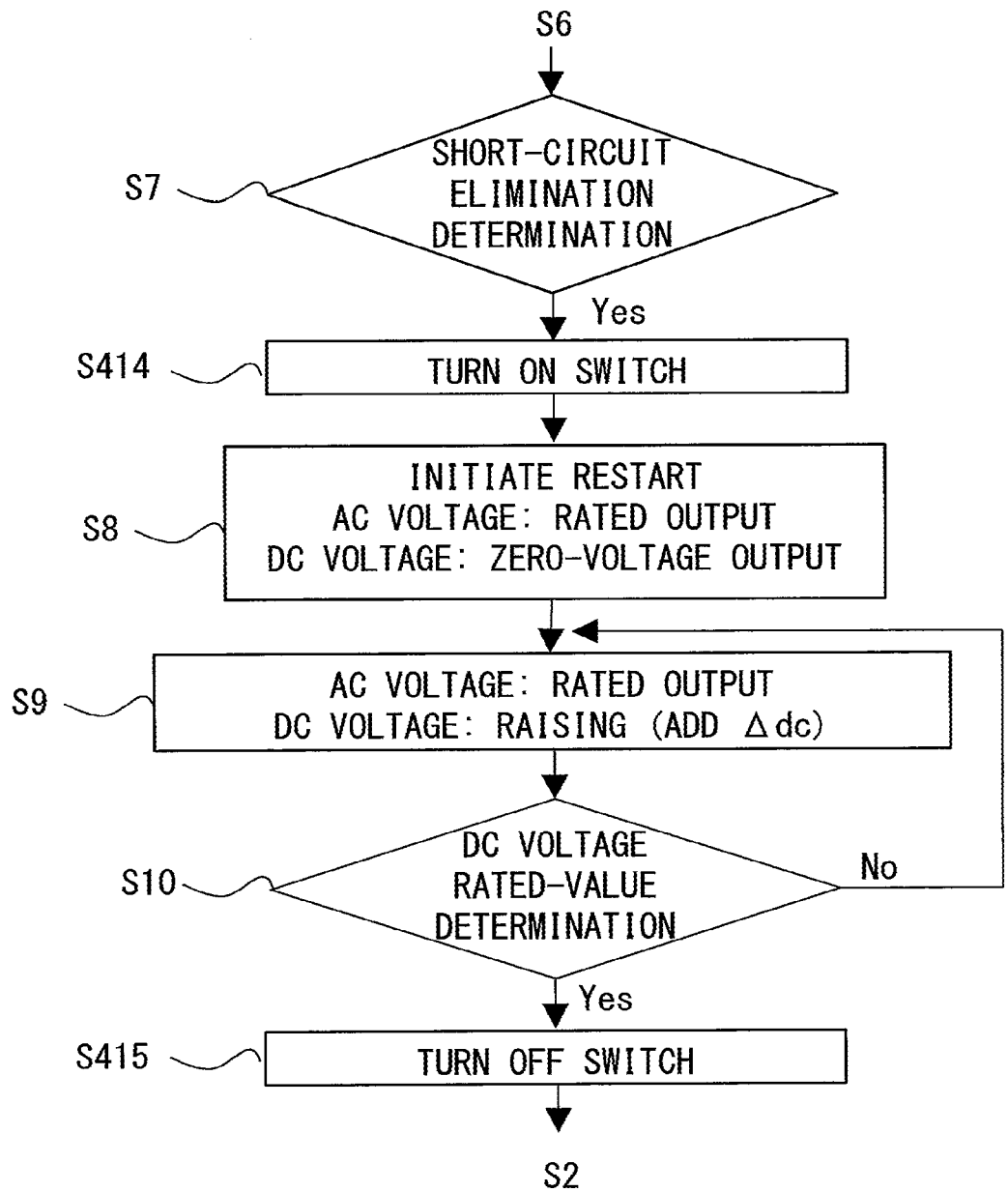
FIG. 14 is a flowchart showing control operation of the power conversion device according to embodiment 4 of the present invention.

FIG. 14 is a flowchart showing control operation of the power conversion device according to embodiment 4.

The same control operation as that in steps S1 to S10 described in embodiment 1 is performed also in the present embodiment, and for convenience sake, steps S1 to S6 of this control operation are not shown in the drawing.

As shown in FIG. 13, a device 15 in which a resistor 15*r* as an impedance and a switch 15*s* are connected in series is connected between the DC lines 13P, 13N. Further, as shown in FIG. 14, step S414 is newly provided between step S7 and step S8 described in embodiment 1 and step S415 is newly provided subsequently to step S10. Such points are differences from embodiment 1.

The device 15 is used as a current route for negative-polarity current in at the time of restart control, but is not used in steady control and protection control of the power converter 1. Therefore, in steady control and protection control of the power converter 1, the switch 15*s* is turned off so that current does not flow into the resistor 15*r*.

Control by the control device 50 using the device 15 will be described with reference to FIG. 14.

Through step S1 to step S7 described in embodiment 1, the control device 50 performs protection control for suppressing short-circuit current ia, and then determines whether or not the short-circuit between the DC terminals P and N has been eliminated.

Next, if it is determined in step S7 that the short-circuit between the DC terminals P and N has been eliminated, the control device 50 causes the switch 15*s* of the device 15 to be closed (step S414).

Next, as in step S8 to step S10 of embodiment 1, the control device 50 adds the adjustment voltage value Δdc which is a minute DC voltage value, to the DC voltage command value Vdc-* for the second arm 6, thereby raising the DC voltage Vdc, and determines whether or not the voltage between the DC terminals P and N has reached the rated value.

In embodiment 1, negative-polarity current in is caused to flow through the phase arm 4 of the power converter 1, using the stray impedances ZP, ZN that the DC lines 13P, 13N have. In the present embodiment, in the restart control, the switch 15*s* is closed, whereby negative-polarity current in is caused flow via the resistor 15*r*.

If the control device 50 determines in step S10 that the voltage between the DC terminals P and N has reached into the rated voltage value range, the control device 50 causes the switch 15*s* of the device 15 to be opened (step S415), switches the operation mode to steady control, and starts power transmission.

The power conversion device of the present embodiment 4 configured as described above provides the same effects as in the above embodiment 1, and thus it becomes possible to swiftly start up the power converter 1 in accordance with the voltage command value.

Further, since the route through which the negative-polarity current in flows in restart control of the power converter 1 is reliably ensured by providing the device 15, the effect of raising the DC voltage in accordance with the voltage command value is improved and it becomes possible to perform stable restart.

In the configuration example of the device 15, the resistor 15*r* is used. However, another impedance such as a reactor or a capacitor may be used.

The resistance value of the resistor 15*r* may be determined on the basis of the speed of gradual increase of the DC voltage Vdc on the DC line 13P in the restart control.

Embodiment 5

Figure 15:
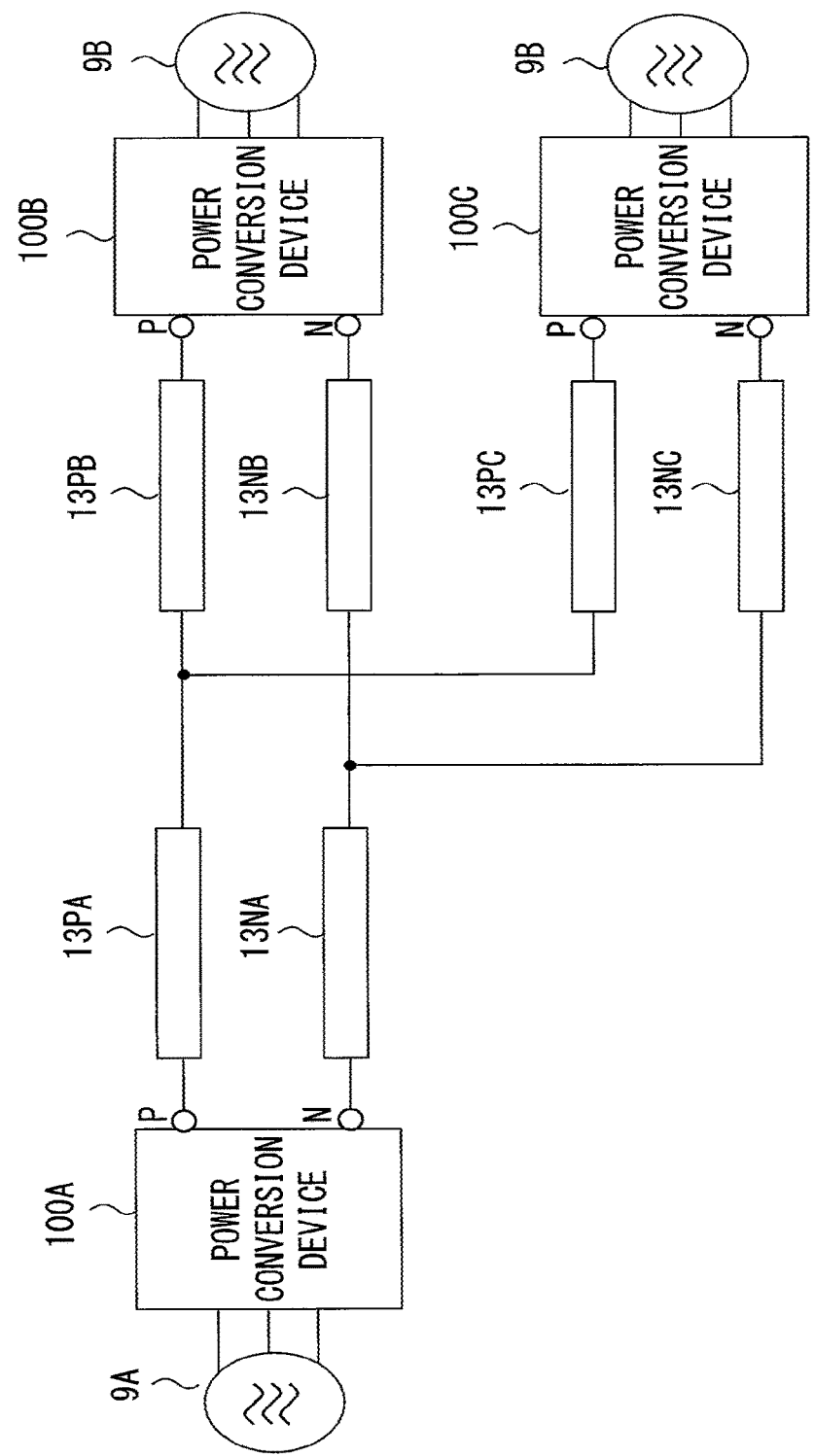
FIG. 15 is a schematic configuration diagram of an HVDC system according to embodiment 5 of the present invention.

FIG. 15 is a schematic configuration diagram of a three-terminal HVDC system 570 configured using a plurality of power conversion devices, according to embodiment 5 of the present invention.

In FIG. 15, the power conversion devices 100 described in embodiment 1 are denoted by 100A, 100B, and 100C.

As shown in FIG. 15, in the three-terminal HVDC system 570 as a power system, the AC sides of the power conversion devices 100A, 100B, 100C are connected to three-phase AC power supplies 9A, 9B, 9C, respectively. The DC terminals P and N on the DC sides of the power conversion devices 100A, 100B, 100C are connected to each other via DC lines 13PA, 13NA, 13PB, 13NB, 13PC, 13NC.

Hereinafter, in the HVDC system having a three-terminal configuration as described above, restart control of each power conversion device 100A, 100B, 100C after the DC lines are short-circuited will be described.

For example, the case where short-circuit occurs at the DC lines 13PA, 13NA on the power conversion device 100A side will be described.

When short-circuit is detected, each of the power conversion devices 100A, 100B, 100C switches the operation mode from steady control to protection control.

When having detected elimination of the short-circuit, the power conversion device 100A switches the operation mode of the power conversion device 100A from protection control to restart control, and raises the DC terminal voltage in a ramp function shape from zero to the rated value while performing rated output to the three-phase AC power supply 9A. Thereafter, the power conversion devices 100B, 100C are sequentially started up to start power transmission.

It is noted that each power conversion device 100A, 100B, 100C can also operate as a STATCOM for supplying reactive power to the three-phase AC power supply 9A, 9B, 9C in protection control.

As a configuration example of multi-terminal HVDC system, a three-terminal HVDC system has been shown in the present embodiment. However, the number of DC terminals may be four or more, and the number of terminals of the DC lines and the connection manner thereof are not limited to those shown in FIG. 15.

Embodiment 6

Figure 16:
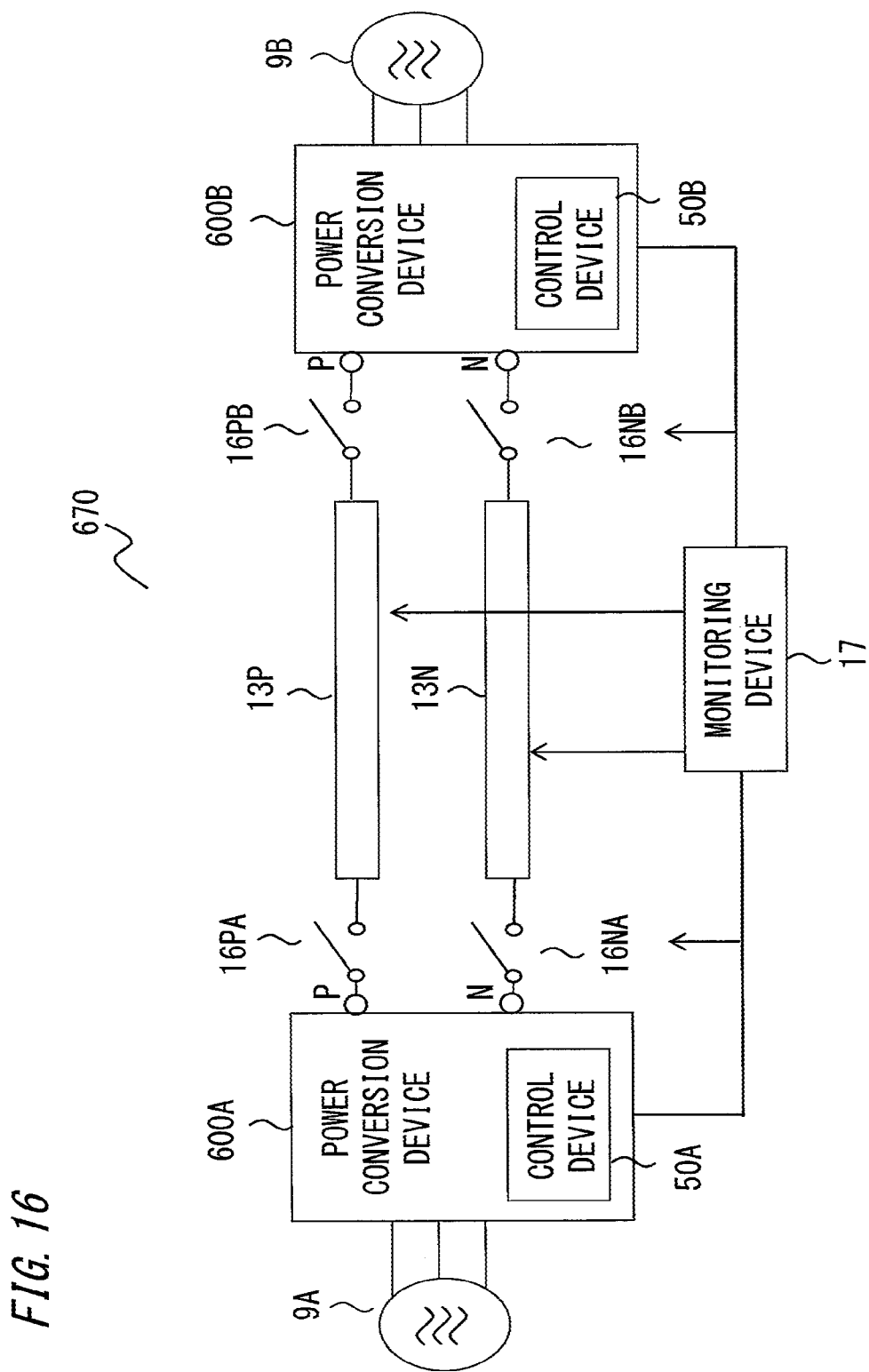
FIG. 16 is a schematic configuration diagram of an HVDC system according to embodiment 6 of the present invention.

FIG. 16 is a schematic configuration diagram of a two-terminal HVDC system 670 configured using two power conversion devices, according to embodiment 6 of the present invention.

The two-terminal HVDC system 670 as a power conversion system includes a power conversion device 600A, a power conversion device 600B, and a monitoring device 17. The power conversion device 600A is provided with second switches 16PA, 16NA connected to DC terminals P, N on the DC side. Similarly, the power conversion device 600B is provided with second switches 16PB, 16NB connected to DC terminals P, N on the DC side.

As shown in FIG. 16, the DC terminals P, N of the power conversion device 600A are connected to DC lines 13P, 13N via the second switches 16PA, 16NA. The DC terminals P, N of the power conversion device 600B are connected to the DC lines 13P, 13N via the second switches 16PB, 16NB.

The AC side of the power conversion device 600A is connected to a three-phase AC power supply 9A, and the AC side of the power conversion device 600B is connected to a three-phase AC power supply 9B.

The monitoring device 17 constantly monitors voltage or current of the DC lines 13P, 13N, the operation states of the power conversion devices 600A, 600B, and the open/close states of the second switches 16PA, 16NA, 16PB, 16NB. Such information monitored by the monitoring device 17 is constantly transmitted to the power conversion devices 600A, 600B.

Hereinafter, in the HVDC system 670 having a two-terminal configuration as described above, restart control of the power conversion devices 600A, 600B after the DC lines are short-circuited will be described.

For example, the case where short-circuit occurs between the second switch 16PA and the second switch 16NA provided to the power conversion device 600A and between the DC line 13P and the DC line 13N will be described.

When short-circuit has occurred between the second switch 16PA and the second switch 16NA and between the DC line 13P and the DC line 13N, control devices 50A, 50B of the power conversion devices 600A, 600B detect the short-circuit and switches their operation modes from steady control to protection control. At the same time, the control devices 50A, 50B cause the switches 16PA, 16NA, 16PB, 16NB to be opened, to disconnect the power conversion devices 600A, 600B from the short-circuited route.

It is noted that detection of short-circuit occurrence by the control devices 50A, 50B may be performed on the basis of the value of the DC current Idc as described in embodiment 1. Alternatively, the control devices 50A, 50B may detect the short-circuit on the basis of monitored information about voltage or current of the DC lines 13P, 13N transmitted from the monitoring device 17.

Here, it is assumed that the short-circuit between the second switch 16PA and the second switch 16NA and between the DC line 13P and the DC line 13N has been eliminated. When having detected the short-circuit elimination on the basis of monitored information about voltage or current of the DC lines 13P, 13N transmitted from the monitoring device 17, the control device 50A of the power conversion device 600A causes the second switches 16PA, 16NA to be closed. On the other hand, the control device 50B of the power conversion device 600B keeps the second switches 16PB, 16NB in an opened state.

Next, the control device 50A of the power conversion device 600A determines that the second switches 16PB, 16NB provided to the power conversion device 600B are in an opened state, on the basis of monitored information about the open/close states of the second switches 16PB, 16NB transmitted from the monitoring device 17. Then, after the determination, the control device 50A of the power conversion device 600A switches the operation mode of the power converter 1 of the power conversion device 600A from protection control to restart control.

Then, using the impedances that the DC lines 13P, 13N have, the control device 50A of the power conversion device 600A causes negative-polarity current in to flow through the phase arm 4 of the power converter 1 of the power conversion device 600A, thereby raising the voltage between the DC terminals P, N in a ramp function shape from zero to the rated value.

During a period in which the power conversion device 600A is performing restart control as described above, the power conversion device 600B is continuing protection control.

Next, the control device 50B of the power conversion device 600B detects that the short-circuit has been eliminated and the power conversion device 600A has been restarted, on the basis of monitored information about the operation state of the power conversion device 600A and monitored information about voltage or current of the DC lines 13P, 13N, which are transmitted from the monitoring device 17. Then, the control device 50B of the power conversion device 600B switches the operation mode of the power converter 1 of the power conversion device 600B to restart control, and causes the second switches 16PB, 16NB to be closed.

In the above description, the power conversion devices 600A, 600B obtain voltage or current of the DC lines 13P, 13N, the operation states of the power conversion devices 600A, 600B, and the open/close states of the second switches 16PA, 16NA, 16PB, 16NB, from the monitoring device 17. However, the configuration is not limited to the above one. For example, a sensor may be provided which is capable of monitoring voltage or current of the second DC lines 13P, 13N even after the power conversion device 600A is disconnected from the second DC lines 13P, 13N by the second switches 16PA, 16NA.

As a configuration example for transmitting information about the operation states of the power conversion devices 600A, 600B to each other, the power conversion devices 600A, 600B may have respective transmission/reception units for the operation states.

In the above description, the power conversion device 600B performs restart control after the power conversion device 600A performs restart control. However, among the plurality of power conversion devices, the power conversion device that has priority to perform restart control may be optionally selected and set, and this setting information may be stored in the control devices of the respective power conversion devices.

In the power conversion system of the present embodiment 6 configured as described above, the control device 50A of the power conversion device 600A performs restart control after determining that the second switches 16PB, 16NB provided to the power conversion device 600B are in an opened state. Therefore, during restart control of the power conversion device 600A, the power conversion device 600B is disconnected from the DC line 13P, 16N by the switches 16PB, 16NB. Thus, current does not flow into the power conversion device 600B when the power conversion device 600A performs restart control, whereby the power conversion device 600A can perform stable restart control.

It is noted that, within the scope of the present invention, the above embodiments may be freely combined with each other, or each of the above embodiments may be modified or simplified as appropriate.

The invention claimed is:

1. A power conversion device comprising:
a power converter including a plurality of phase arms in which a first arm and a second arm for each of phases are connected in series to each other, the plurality of phase arms being connected in parallel between positive and negative DC lines, the power converter performing power conversion between three-phase AC and DC; and
a control device which generates respective voltage command values for the first arm and the second arm and performs drive-control of the power converter on the basis of the voltage command values, wherein
the first arm and the second arm each include a converter cell composed of: a first series body having semiconductor switching elements in both of upper and lower arms; and a DC capacitor connected in parallel to the first series body,
the converter cell in the second arm is a second converter cell formed by connecting the DC capacitor, the first series body, and a second series body in parallel, the second series body having a semiconductor switching element in one of upper and lower arms and a diode in the other one, the second converter cell being configured to output positive-polarity and negative-polarity voltages corresponding to a magnitude of both-end voltage of the DC capacitor,
when short-circuit between the DC lines is detected, the control device performs protection control to turn off the semiconductor switching elements in the power converter, and
when elimination of the short-circuit between the DC lines is detected, the control device performs restart control of the power converter by giving a voltage command value for causing negative-polarity current flowing through the diode to flow to the phase arm, to each converter cell in the first arm and the second arm.

2. The power conversion device according to claim 1, wherein
in the restart control, the control device gives a voltage command value including a positive-polarity DC voltage command value, to the converter cell in the first arm, and gives a voltage command value including a DC voltage command value that gradually increases from a negative polarity to a positive polarity, to the second converter cell in the second arm, thereby outputting DC voltage that gradually increases, to the DC lines, while causing the negative-polarity current flowing through the diode to flow to the phase arm, using an impedance that the DC lines have.

3. The power conversion device according to claim 2, wherein
in the restart control, when elimination of the short-circuit between the DC lines is detected, the control device gives a voltage command value including a rated AC voltage command value and a positive-polarity rated DC voltage command value, to the converter cell in the first arm, and gives a voltage command value including a rated AC voltage command value and a DC voltage command value that gradually increases from a negative-polarity rated DC voltage command value to a positive-polarity rated DC voltage command value, to the second converter cell in the second arm.

4. The power conversion device according to claim 3, wherein
in the restart control, when it is detected that voltage of the DC capacitor in the second converter cell is out of a predetermined voltage value range, the control device adjusts a voltage command value for the second converter cell in the second arm so that a speed of gradual increase of DC voltage on the DC lines becomes faster than that at a time of the detection.

5. The power conversion device according to claim 2, wherein
in the restart control, when it is detected that voltage of the DC capacitor in the second converter cell is out of a predetermined voltage value range, the control device adjusts a voltage command value for the second converter cell in the second arm so that a speed of gradual increase of DC voltage on the DC lines becomes faster than that at a time of the detection.

6. The power conversion device according to claim 2, wherein
the impedance is a stray impedance between the DC lines and a ground.

7. The power conversion device according to claim 2, wherein
a capacitance as the impedance is provided between the positive and negative DC lines, and
in the restart control, the control device causes the negative-polarity current to flow to the phase arm via the capacitance.

8. The power conversion device according to claim 2, wherein
a resistor as the impedance and a first switch connected in series to the resistor are provided between the positive and negative DC lines, and
when elimination of the short-circuit between the DC lines is detected, the control device performs the restart control after causing the first switch to be closed, and causes the first switch to be opened after voltage of the DC lines has reached into a rated voltage value range.

9. The power conversion device according to claim 2, wherein
the second series body has a semiconductor switching element to which the diode is connected in parallel, in the other one, and
in the restart control, the control device fixes the semiconductor switching element of the other one in the second series body, in an OFF state.

10. The power conversion device according to claim 9, wherein
in the restart control, when elimination of the short-circuit between the DC lines is detected, the control device gives a voltage command value including a rated AC voltage command value and a positive-polarity rated DC voltage command value, to the converter cell in the first arm, and gives a voltage command value including a rated AC voltage command value and a DC voltage command value that gradually increases from a negative-polarity rated DC voltage command value to a positive-polarity rated DC voltage command value, to the second converter cell in the second arm.

11. The power conversion device according to claim 1, wherein
the second series body has a semiconductor switching element to which the diode is connected in parallel, in the other one, and
in the restart control, the control device fixes the semiconductor switching element of the other one in the second series body, in an OFF state.

12. The power conversion device according to claim 11, wherein
in steady control of the power converter, the control device fixes the semiconductor switching element of the other one in the second series body, in an OFF state.

13. The power conversion device according to claim 11, wherein
in the restart control, when elimination of the short-circuit between the DC lines is detected, the control device gives a voltage command value including a rated AC voltage command value and a positive-polarity rated DC voltage command value, to the converter cell in the first arm, and gives a voltage command value including a rated AC voltage command value and a DC voltage command value that gradually increases from a negative-polarity rated DC voltage command value to a positive-polarity rated DC voltage command value, to the second converter cell in the second arm.

14. The power conversion device according to claim 13, wherein
in the restart control, when it is detected that voltage of the DC capacitor in the second converter cell is out of a predetermined voltage value range, the control device adjusts a voltage command value for the second converter cell in the second arm so that a speed of gradual increase of DC voltage on the DC lines becomes faster than that at a time of the detection.

15. The power conversion device according to claim 1, wherein
all the converter cells in the first arm are first converter cells each formed by connecting the DC capacitor and the first series body in parallel and having a half-bridge configuration.

16. The power conversion device according to claim 1, wherein
all the converter cells in the first arm are the second converter cells.

17. The power conversion device according to claim 1, wherein
the first arm is composed of: a first converter cell formed by connecting the DC capacitor and the first series body in parallel and having a half-bridge configuration; and the second converter cell.

18. The power conversion device according to claim 1, wherein
a sum of charge voltages of the DC capacitors of the second converter cells connected in a short-circuit current route of the power converter when the DC lines are short-circuited, is higher than voltage between AC lines of the power converter.

19. A power system comprising a plurality of the power conversion devices according to claim 1, wherein
the DC lines of the power converters of the power conversion devices are connected to each other.

20. The power system according to claim 19, wherein
the plurality of power conversion devices are each provided with a second switch connected to a DC terminal on a DC side of the power converter, and are connected to the DC lines via the second switches,
when short-circuit between the DC lines is detected, the plurality of power conversion devices cause the respective second switches to be opened, and perform the protection control, and
when elimination of the short-circuit between the DC lines is detected, a predetermined one of the plurality of power conversion devices causes the second switch provided to the predetermined power conversion device, to be closed, and after it is determined that the second switch provided to the other power conversion device is in an opened state, the predetermined power conversion device performs the restart control.

* * * * *